United States Patent
Murazaki

(10) Patent No.: US 7,733,002 B2
(45) Date of Patent: *Jun. 8, 2010

(54) SEMICONDUCTOR LIGHT EMITTING DEVICE PROVIDED WITH AN ALKALINE EARTH METAL BORIC HALIDE PHOSPHOR FOR LUMINESCENCE CONVERSION

(75) Inventor: Yoshinori Murazaki, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/230,127

(22) Filed: Aug. 25, 2008

(65) Prior Publication Data

US 2008/0315235 A1    Dec. 25, 2008

Related U.S. Application Data

(62) Division of application No. 10/511,723, filed on Oct. 19, 2004, now Pat. No. 7,432,642.

(51) Int. Cl.
     *H05B 33/00*      (2006.01)
     *C09K 11/61*      (2006.01)
     *C09K 11/77*      (2006.01)
     *C09K 11/85*      (2006.01)

(52) U.S. Cl. ........................ 313/486; 313/501; 313/503; 313/485; 257/98; 257/99; 252/301.4 H; 252/301.4 R

(58) Field of Classification Search ......... 313/486–487, 313/498–512; 257/98–100; 252/301.4 R, 252/301.4 H
See application file for complete search history.

(56) References Cited

U.S. PATENT DOCUMENTS

| | | | |
|---|---|---|---|
| 2,988,516 A | 6/1961 | Kamiya | |
| 5,998,925 A | 12/1999 | Shimizu et al. | |
| 6,069,440 A | 5/2000 | Shimizu et al. | |
| 6,466,135 B1 * | 10/2002 | Srivastava et al. | 313/486 |
| 6,608,332 B2 | 8/2003 | Shimizu et al. | |
| 6,614,179 B1 | 9/2003 | Shimizu et al. | |
| 6,744,071 B2 | 6/2004 | Sano et al. | |
| 7,432,642 B2 * | 10/2008 | Murazaki | 313/486 |
| 2001/0022495 A1 | 9/2001 | Salam | |

(Continued)

FOREIGN PATENT DOCUMENTS

EP      0 529 956      3/1993

(Continued)

*Primary Examiner*—Mariceli Santiago
(74) *Attorney, Agent, or Firm*—Wenderoth, Lind & Ponack, L.L.P.

(57) ABSTRACT

A light emitting device is provided that has a semiconductor light emitting element and a phosphor which converts a part of the luminescence spectrum emitted from the semiconductor light emitting element. The luminescence spectrum of the semiconductor light emitting element is located between a near ultraviolet region and a short-wavelength visible region, and the phosphor is made by adding a red luminescent activator to a base material of a blue luminescent phosphor. Thereby, improving the color shading generated by the dispersion of the spectra of the light emitting elements and obtaining the light emitting device having a high brightness and a good color rendering properties. With the light emitting device, it is possible to provide the light sources for the lighting apparatus of medical treatments, the flash plate of a copying machine, etc., in which a good color rendering property is required.

5 Claims, 6 Drawing Sheets

U.S. PATENT DOCUMENTS

| | | |
|---|---|---|
| 2004/0000868 A1 | 1/2004 | Shimizu et al. |
| 2004/0004437 A1 | 1/2004 | Shimizu et al. |
| 2004/0090180 A1 | 5/2004 | Shimizu et al. |

FOREIGN PATENT DOCUMENTS

| | | |
|---|---|---|
| EP | 1354929 A2 | 10/2003 |
| JP | 55043101 A | 3/1980 |
| JP | 05-152609 | 6/1993 |
| JP | 5-214338 | 8/1993 |
| JP | 09-153645 | 6/1997 |
| JP | 09-281900 | 10/1997 |
| JP | 10-112557 | 4/1998 |
| JP | 10-190053 | 7/1998 |
| JP | 10-242513 | 9/1998 |
| JP | 11-298047 | 10/1999 |
| JP | 2000-17257 | 1/2000 |
| JP | 2000183408 A * | 6/2000 |
| JP | 2001-308393 | 11/2001 |
| JP | 2001-352101 | 12/2001 |
| JP | 2002359404 A | 12/2002 |

* cited by examiner

SEMICONDUCTOR LIGHT EMITTING DEVICE PROVIDED WITH AN ALKALINE EARTH METAL BORIC HALIDE PHOSPHOR FOR LUMINESCENCE CONVERSION

This a Divisional Application of application Ser. No. 10/511,723, filed Oct. 19, 2004 now U.S. Pat. No. 7,432,642, the contents of which are incorporated herein in its entirety.

BACKGROUND OF THE INVENTION

1. Field of the Invention

The invention is related to a light emitting device having a light emitting element and a phosphor, which can be used for various light sources such as a signal light, lighting, a display, an indicator. Especially, the present invention provides the light emitting device which can emit a white light by using the phosphor which is excited by the emission spectrum from the light emitting element and capable of emitting a visible light.

2. Description of the Related Art

Various light emitting diodes and laser diodes are developed as a semiconductor light emitting device today. Such a semiconductor light emitting device has begun to substitute for an electric bulb and a cold cathode tube as various light sources, such as a display, a back light and an indicator. These light sources use the strong points of a low-voltage drive, small sizing, lightweight, thin shape, high reliability with a long-life, low electrical power consumption.

Especially, the light emitting element using a nitride semiconductor has been developed as a light emitting element which can emit a light in a range from the ultraviolet region to the short wavelength side of visible light. The blue or green LED of more than 10 candela has an active (light emitting) layer of quantum well structure made of nitride semiconductor (for example, mixed crystal of InGaN) and has been developed and commercialized.

A display of mixed-color including white is realized by combination of the light from such a LED chip 1 and the light from the phosphor which is excited by the emitted light. For example, such devices are mentioned in the JP,5-152609,A, JP,9-153645,A, JP,10-242513,A, etc.

More concretely, the light emitting element emits an ultraviolet light or a blue light which has a relatively short wavelength in visible light. It is the light emitting diode which excites a phosphor in order to emit the visible light having a wavelength longer than the wavelength of the light emitting element. When a part of light from a light emitting element is used as transmitted light, there are advantages such that the structure can be simplified and the output can be easily improved.

On the other hand, when a light emitting element which emits an ultraviolet light is used, a white light is emitted by combining the phosphors which can emit RGB (red, green, blue) lights. In this configuration, since the lights emitted from the phosphors are basically used only, a color adjustment can be performed comparatively easily. Especially, when a wavelength of the ultraviolet region is used, since the variations, such as wavelength of a semiconductor light emitting element, are canceled and the chromaticity is determined by only luminescence colors of the phosphors, the productivity is improved as compared with the case where the semiconductor light emitting element which emits a visible light is used.

However, to utilize the light emitting device with the advantages of semiconductor light emitting elements as a light source such as a lighting, current light emitting devices are not enough, so improvement in the brightness and improvement in the productivity are required.

Especially, the phosphors, which can be excited by the ultraviolet light or the light of short wavelength in the visible range, and which can emit a red light with sufficient brightness as compared with other blue, green, etc., is not known. For this reason, the luminescent color made from the three primary colors only from phosphors has little red component, so such a luminescent color is felt as a somber color since the red component is not reproduced. On the other hand, if mixed rate of a red phosphor is raised to improve the color rendering property, relative luminance will fall.

If the excitation spectrum curve of the phosphor with respect to the luminescent spectrum of the light emitting element is varied significantly, although the luminescent spectrum emitted from the light emitting element is positioned in a region of ultraviolet range or visible range of which visual sensitivity is very small, the variation in a color tone may arise between the light emitting devices, because the slight variation of the excitation spectrum from the light emitting element generate variation of the brightness of the phosphor.

Furthermore, when the excitation light spectral band width of a phosphor is narrow, the reliability of the light emitting device will be spoiled by the ultraviolet or near-ultraviolet light which is not absorbed by the phosphor among the light emitted from the light emitting element. If organic materials are used for the package housing the light emitting element, sealing member for protecting the light emitting element, the binder member for the phosphor, the output power is depredated and luminescent color is shifted by coloring or degradation of the organic materials caused by the light which is not absorbed by the phosphor.

Moreover, in order to improve productivity, it is necessary to realize various desired colors by adjusting composition of one phosphor.

BRIEF SUMMARY OF THE INVENTION

Accordingly, an object of the present invention is to provide a light emitting device in which deterioration of output power and color shift are extremely small and a color rendering properties are good.

The inventor accomplished the present invention based on following ideas (1) and (2) in the light emitting device having a light emitting element and a phosphor.

(1) It is necessary to achieve the object that the light emitting element has a luminescence spectrum in a range from near ultraviolet region to short-wavelength visible region so as to make the visual sensitivities of the variation of the luminescence spectrum emitted from the light emitting element extremely small.

(2) It is necessary to achieve the object that the phosphor is able to convert at least a part of the luminescence spectrum of the light emitting element and has an excitation spectrum curve which is not changed significantly and which has a flat and wide portion near the peak, and the phosphor can be adjusted so as to have various desired chromaticness by adjusting the composition.

A light emitting device related to the present invention has a semiconductor light emitting element and a phosphor which converts a part of the luminescence spectrum emitted from the semiconductor light emitting element. The light emitting device characterized in that the semiconductor light emitting element has a luminescence spectrum located between a near ultraviolet region and a short-wavelength visible region, and the phosphor is made by adding a red luminescent activator to a base material of a blue luminescent phosphor.

The double activated phosphor which is used in the light emitting device of the invention and which is made by adding a red luminescent activator to a base material of a blue luminescent phosphor has a stable excitation spectrum curve with a little change in the vicinity of the wavelength where luminescence efficiency is high. Moreover, the excitation spectrum has two or more peaks each of which has a broad half band width. In the excitation spectrum curve, the parts between the adjacent peaks are nearly flat respectively. With this, since the phosphor can absorb a light with a wavelength of the ultraviolet region which damages organic members and can convert to the light of longer wavelength, the light emitting devices which have a good reliability and small dispersion in color tones can be obtained. The changes from the peaks in the excitation spectrum curve between the peaks are preferably in a range from 0 arb. unit to 0.2 arb. unit, more preferably in a range from 0 arb. unit to 0.1 arb. unit, most preferably in a range from 0 arb. unit to 0.05 arb. unit. Moreover, the phosphor used in the present invention is made by adding a red luminescent activator which emits a light of longer wavelength to a base material of a blue luminescent phosphor which emits a light of shorter wavelength, and various desired chromaticness can be realized by adjusting the added ratio of the red luminescent activator.

In the device of the present invention, the light emitting device of simple structure with good productivity can be constituted by setting the main peak wavelength of the semiconductor light emitting element to 360 nm or more in a range of the ultraviolet region.

An another aspect of the light emitting device according to the present invention has a semiconductor light emitting element and a phosphor capable of converting a part of a luminescence spectrum emitted from the semiconductor light emitting element. The light emitting device is characterized in that the luminescence spectrum of the semiconductor light emitting element is located between a near ultraviolet region and a short-wavelength visible region, and the phosphor is an alkaline earth metal boric halide phosphor including at least one element represented by M selected from the group consisting of Mg, Ca, Ba, and Sr and at least one element represented by M' selected from the group consisting of Mn, Fe, Cr, and Sn. With this, the light emitting device which is capable of emitting a white light with high brightness and which has a good productivity can be obtained.

In the light emitting device of the present invention, it is preferable that the light emitting layer of the semiconductor light emitting element is made of a nitride semiconductor including at least In and Ga or a nitride semiconductor including at least Ga and Al. Because such a semiconductor light emitting element can emit a light in a region ranging from the long wavelength side of ultraviolet to the short wavelength side of visible region and has a narrow luminescence spectrum width, the phosphor can be excited efficiently and the light emitting device can be emit a light of the luminescence spectrum of which color tone is not affected by the light emitting element. It is to be understood that these may include the nitride semiconductor having In, Al and Ga.

In the light emitting element of the present invention, the phosphor is an alkaline earth metal boric halide phosphor activated by at least Mn and Eu. The phosphor has a good light resistance and a good heat resistance and can absorb the luminescence spectrum emitted from the light emitting element efficiently. It is possible to emit a light of a white region and the region can be adjusted by the composition. Moreover, it is possible to absorb a light of the longer wavelength side of ultraviolet region and to emit a light of yellow or red color with high brightness. Therefore, the light emitting device having a good color rendering properties can be obtained. It is to be understood that the alkaline earth metal boric halide phosphor includes an alkaline earth metal boric-chlor phosphor.

In the light emitting element of the present invention, the phosphor may be a phosphor represented by a formula of $(M_{1-x-y}Eu_xM'_y)_2B_5O_9M''$ (where M is at least one selected from the group consisting of Mg, Ca, Ba, sr and M' is at least one selected from the group consisting of Mn, Fe, Cr and Sn, $0.0001 \leq x \leq 0.5$, $0.0001 \leq y \leq 0.5$, M'' is at least one halogen selected from the group consisting of F, Cl, Br and I). With this, the light emitting device which is capable of emitting the mixed color light and has a good productivity can be obtained.

An another aspect of the light emitting device according to the present invention includes a semiconductor light emitting element of which luminescence spectrum is located between a near ultraviolet region and a short-wavelength visible region, and a first phosphor which converts a part of a luminescence spectrum emitted from the semiconductor light emitting element. The first phosphor is made by adding an activator for red light emission to a base material of a blue emitting phosphor. This another aspect of the light emitting device is characterized that a second phosphor which can convert a part of the light emitted from the first phosphor to a light having a wavelength in a region ranging from blue region to red region is included, and a light which has a wavelength within a range of white region is emitted by mixing of the light emitted from the first phosphor and the light emitted from the second phosphor.

The light emitting device of the present invention may include a phosphor selected from the group consisting of;

an alkaline earth halogen apatite phosphor activated by Eu, or Eu and Mn [$(Sr, Ca, Ba, Mg)_5(PO_4)_3(F, Cl, Br)$:Eu, Mn], an alkaline earth metal aluminate phosphor [$SrAl_2O_4$:Eu, $Sr_4Al_{14}O_{25}$:Eu,Mn, $CaAl_2O_4$:Eu(Mn), $BaMg_2Al_{16}O_{27}$:Eu, $BaMg_2Al_{16}O_{27}$:Eu,Mn and $BaMgAl_{10}O_{17}$:Eu (Mn)], an yttrium aluminate phosphor activated by cerium, a rare earth acid sulfide phosphor activated by Eu ($La_2O_2S$:Eu, $Y_2O_2S$:Eu and $Gd_2O_2S$:Eu), an organic complex phosphor activated by Eu [$(Sr, Ca, Ba, Mg)_5(PO_4)_3Cl$:Eu, ZnS:Cu, $Zn_2GeO_4$:Mn, $(Sr, Ca, Ba, Mg)Ga_2S_4$:Eu, and $(Sr, Ca, Ba, Mg)_2Si_5N_8$:Eu]. With this, the color tone can be adjusted in detail and a white light having good color rendering properties can be obtained with a relatively simple construction.

DETAILED DESCRIPTION OF THE INVENTION

Figure 2A:
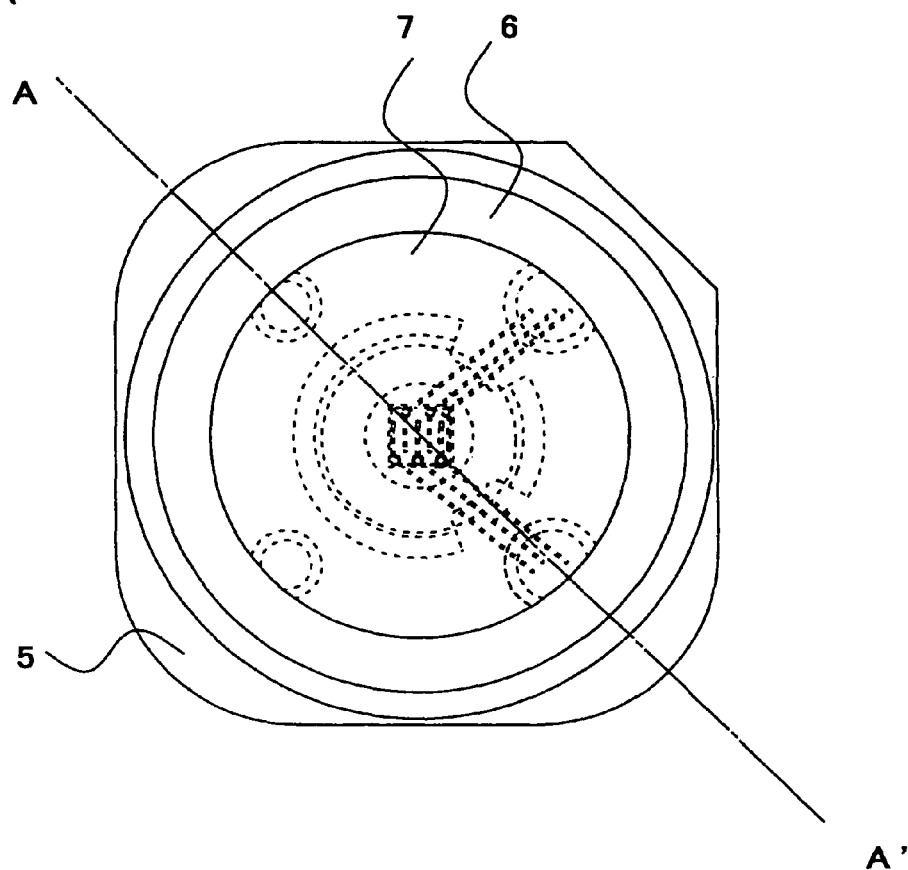
FIG. 2A is a plan view showing a surface mounting type light emitting device of the present invention.
Figure 2B:
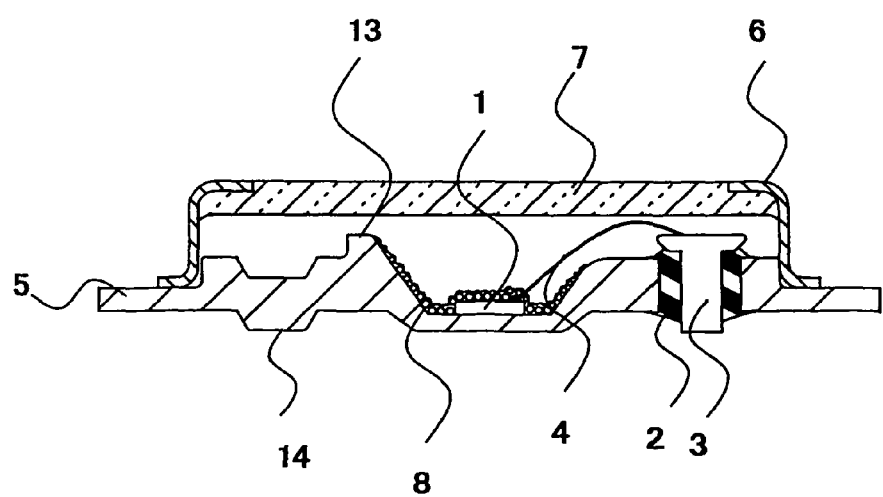
FIG. 2B is a schematic cross-sectional view showing a surface mounting type light emitting device of the present invention.

Referring to FIG. 2, an embodiment of the present invention will be described in detail. A surface mounting type light emitting device shown in FIG. 2 is formed. A nitride semiconductor light emitting element comprising InGaN semiconductor which has a light emitting layer having an emission peak wavelength of about 400 nm as shown in FIG. 6B is used as the light emitting element. More specifically, the light emitting element has a structure in which an n-type GaN layer of undoped nitride semiconductor, a GaN layer which is an n-type contact layer doped with Si to be formed with n-type electrode, an n-type GaN layer of undoped nitride semiconductor, an n-type AlGaN layer of nitride semiconductor and a light emitting layer having a single quantum well structure of InGaN layer are laminated on a sapphire substrate in order. An AlGaN layer as a p-type cladding layer doped with Mg and a GaN layer which is a p-type contact layer doped with Mg are laminated on the light emitting layer in order (A buffer layer of GaN grown at a low temperature is formed on the sapphire substrate. And the p-type semiconductor is annealed at 400° C. or more after growing.) The p-type contact layer and the n-type contact layer are exposed by etching at the same side of laminated nitride semiconductor layers on the sapphire substrate. An n-electrode is formed on the exposed n-type contact layer in a strip shape and a transparent p-electrode of metal thin layer is formed on almost entire surface of the remaining p-type contact layer. A pad electrode is formed on the transparent p-electrode in parallel with the n-electrode by spattering method.

Next, the light emitting element chip 1 is mounted on an iron package which has a thin portion and a thick portion. The package has a recess portion which is the thin portion at a central part and cover lead electrodes 3 plated with Ni/Au are fixed integrally at the thick portion surrounding the recess portion with an insulator 2 between them. The bottom surface of the recess in the thin portion and the bottom surfaces of the lead electrodes 3 are arranged on a same plane and the both of them are designed so as to contact a print circuit board. The LED chip 1 is die-bonded in the recess by an Ag—Sn alloy. With this, the heat generated by LED chip 1 during lighting is released efficiently to the print circuit board side via the thin portion of bottom surface of the recess. The electrodes of LED chip 1 are electrically connected to the main surfaces of the lead electrodes respectively by Ag wires 4.

Next, a color conversion layer including an alkaline earth metal boric-chlor phosphor 8 activated by Eu and Mn of $(Sr_{0.90}Eu_{0.05}Mn_{0.05})_2B_5O_9Cl$ and $SiO_2$ is formed continuously on a surface of the LED chip 1 and an inner wall of the recess by spray coating method. Hereafter, a method for formation of the color conversion layer will be described in detail.

Process 1.

Although an alkyl silicate, a methyl silicate, an ethyl silicate, an N-propyl silicate and an N-butyl silicate as an alkyl silicate may be used, Oligomer liquid of a condensed ethyl silicate having 40 weight % of $SiO_2$ is used in the embodiment. The ethyl silicate is used after solation by hydrolysis with water including a catalyst.

The ethyl silicate sol, ethylene glycol and the phosphor 8 are mixed at the weight ratio of 1:1:1 and stirred to make a coating medium. The ethyl silicate sol tend to be dried easily, so the ethyl silicate sol preferably should be mixed with an organic solvent having a high boiling point (100° C.~200° C.) such as butanol and ethylene glycol to prevent from gelation. Thus, clogging of the nozzle caused by gelation of ethyl silicate sol can be prevented by mixing with the organic solvent having a high boiling point, so that working efficiency can be improved.

Process 2.

The coating medium is poured into a container and is carried from the container to the nozzle by using a circulating pump. A flow rate of the paint is adjusted by a valve. It is characterized in that the atomized coating medium sprayed from the nozzle is atomized and applied with a spiral rotation. Concretely, the atomized coating medium spreads in cone shape near the nozzle and spreads in column shape as the distance from the nozzle increases. With this, since the color conversion layer, in which the phosphor 8 is dispersed uniformly, is formed on all of the upper surface, side surface and corner surface with a uniform thickness, the color shading can be reduced. The phosphor 8 in the color conversion layer is preferably a single-particle layer in which the phosphor particles are arranged laterally to improve an output efficiency. In the present embodiment, the distance between the top surface of the light emitting element and the lower end of the nozzle is adjusted to 40-50 mm so that the surface of the light emitting element is placed in the column shaped atomized coating medium, and the coating medium and gas are jetted to the upper face, the side faces, the corners of the light emitting element and the plane in the recess. With this, the continuous color conversion layer having a substantially uniform thickness can be formed.

Moreover, the above-described process is carried out while warming the portion to be coated. Thus, ethanol and a solvent formed by the solation of ethyl silicate can be evaporated simultaneously with the spray on the light emitting element. With this, the color conversion layer can be formed without damaging the light emitting element. Concretely, the coating medium and gas are jetted to the upper face, side faces and corners of the light emitting element and the plane in the recess for spray coating while placing the light emitting element on the heater. The temperature of the heater is preferably adjusted in a range from 50° C. to 300° C.

Process 3.

Next, the phosphor 8 is fixed with $SiO_2$ by reaction of ethyl silicate sol and the water in the air at the room temperature (25° C.).

Process 4.

Next, drying at 300° C. for two hours is carried out. The performance of the light emitting element deteriorates under a temperature higher than 350° C. Therefore, an alkyl silicate which can fix to the surface of the light emitting element at 300° C. or less is used preferably as a fixing agent.

After the moisture in the recess of the package coated with the phosphor 8 is thoroughly removed, it is sealed with a cover lid having a glass window at a center thereof by way of seam welding. In the present embodiment, the phosphor 8 is fixed in the vicinity of the LED chip. However, the phosphor 8 may be applied on the rear surface or the main face of the light extract portion. With this, the distance between the light emitting element and the phosphor 8 can be kept even and a high reliability can be maintained even if the phosphor 8 is relatively week to heat.

Figure 1:
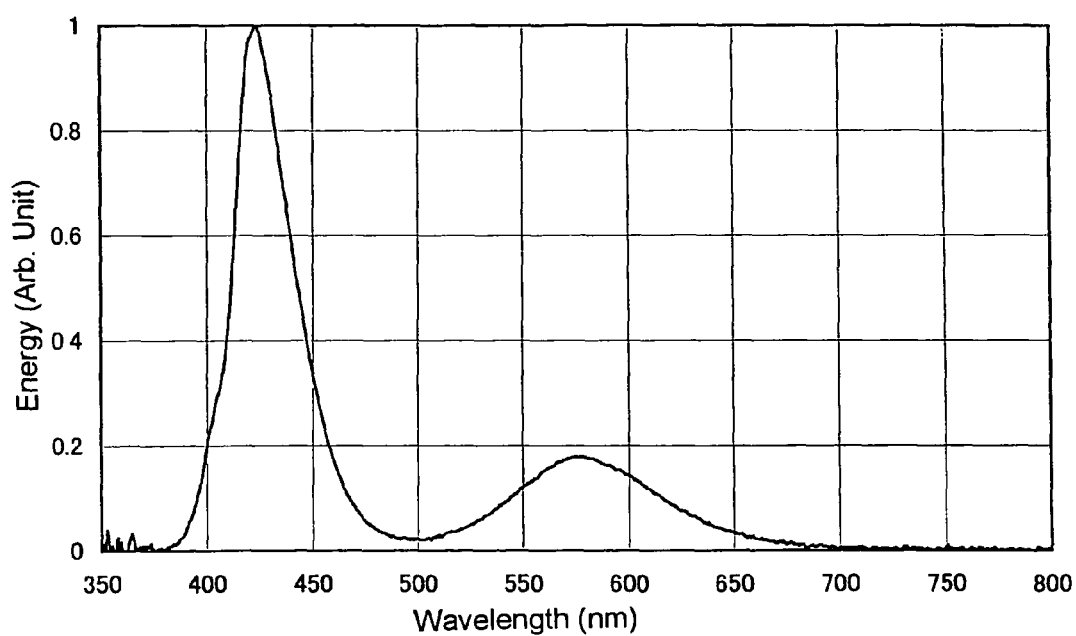
FIG. 1 is an example showing a luminescence spectrum emitted from the light emitting device of the present invention.

The light emitting device made by aforementioned method can emit a white light with high intensity. The luminescence spectrum of the light emitting device is shown in FIG. 1. The light emitting device in which chromaticity can be adjusted easily and which has a good productivity and a high reliability can be made. Each component of the present invention is described in detail.

<Light Emitting Element 1>

In the present invention, the light emitting element 1 has a light emitting layer which can emit the light capable of exciting the phosphor 8. Various semiconductors such as ZnSe and GaN can be given as the material of such semiconductor light emitting element. The nitride semiconductor ($In_XAl_YGa_{1-X-Y}N$, $0 \leq X$, $0 \leq Y$, $X+Y \leq 1$) which can emit a light with short wavelength capable of exciting the phosphor 8 efficiently is more preferably given. The nitride semiconductors may contain Boron and/or Phosphorus arbitrarily. A homojunction structure, a heterojunction structure or a double heterojunction structure which have MIS junction, PIN junction or PN junction are given as a semiconductor structure. The luminescence wave length can be variously selected by the material of semiconductor layers and mix crystal ratio thereof. The active layer may have a single quantum well structure or a multiple quantum well structure in which a semiconductor active layer is formed to be a thin film which generates quantum effect. When the nitride semiconductor is used, materials such as sapphire, spinel, SiC, Si, ZnO and GaN are preferably used as a substrate for the semiconductor. The sapphire substrate is preferably used for forming the nitride semiconductor having good crystallinity in mass production. The nitride semiconductor can be formed on the sapphire substrate using the MOCVD method and the like. A buffer layer made of material such as GaN, AlN and GaAlN is grown on the sapphire substrate, and then the nitride semiconductor having a p-n junction is formed on the buffer layer.

As an example of the light emitting element which has a p-n junction using the nitride semiconductor, a light emitting element having a double hetero-structure in which a first contact layer of n-type gallium nitride, a first clad layer of n-type Aluminum gallium nitride, an active layer of Indium gallium nitride, a second clad layer of p-type Aluminum gallium nitride, and a second contact layer of p-type gallium nitride are laminated in order on the buffer layer is given.

The nitride semiconductor exhibits n-type electro conductivity in a condition where an impurity is not doped. It is preferable to appropriately introduce the n-type dopant such as Si, Ge, Se, Te and C for forming a desired n-type nitride semiconductor, for example, in order to improve luminous efficiency. On the other hand, when p-type nitride semiconductor is formed, it is preferable that the p-type dopant such as Zn, Mg, Be, Ca, Sr and Ba is doped. The nitride semiconductor is hardly made to be the p-type by simply doping with the p-type dopant. Therefore, it is preferable to make it low resistance by heating in a furnace, or plasma irradiation and the like after the p-type dopant is introduced. The light emitting element 1 comprising the nitride semiconductor is prepared by cutting the semiconductor wafer into chips after electrodes have been formed.

In the present invention, a color conversion type light emitting device with a small color tone shading can be made by the combination of a light emitting element having a main emission wavelength in a region from the near ultraviolet to the short-wavelength visible region and the phosphor 8 which absorbs a part of the light emitted from the light emitting element and capable of emitting the light having a different wavelength from the light emitting element. Here, it is preferable to use a resin which is relatively resistant to ultraviolet light or a glass which is an inorganic material substance.

<Metal Package 5>

In the embodiment of the present invention, the metal package 5 has a thin recess portion for housing the light emitting element and a thick portion where the lead electrodes 3 are provided. The bottom surface of the recess portion and the bottom surfaces of the lead electrodes 3 are almost positioned on a same plane.

The metal package 5 is preferably made of the thin plate in consideration of small sizing and the efficient radiation of the heat generated by the light emitting element 1. On the other hand, the contact area between the metal of the package and the insulating member 2 adjacent to the metal need to be larger in order to improve the reliability of the device by reducing the difference in thermal expansion between the metal package and the insulating member 2 adjacent to the metal, so that the metal package 5 is preferably formed with a thick wall. Therefore, in the present invention, the metal package having the thin portion for housing the light emitting element and the thick portion for fixing the lead electrodes 3 is used, so that the light emitting device having a good reliability is provided.

(Phosphor 8)

The phosphor 8 used in the light emitting device of the present invention can emit efficiently by the luminescence spectrum of the light emitting element. The phosphor 8 preferably has an excitation region at least in the ultraviolet region. The phosphor 8 absorbs at least a part of light having a main luminescence wavelength longer than 360 nm in the ultraviolet region and is made by adding a red luminescent activator to a base material of a blue luminescent phosphor. The phosphor of an alkaline earth metal boric halide phosphor in which at least Mn which is a red luminescent activator is included in a base material of a blue luminescent phosphor activated by Eu is given as an example of the phosphor 8.

The phosphor 8 can be made by the following method. The oxides of the elements of the phosphor 8 or compounds which can be transformed to oxides by thermal decomposition and ammonium chloride are weighed as predetermined amounts and mixed by a ball mil. The mixture is placed in a crucible and is fired in a reducing atmosphere of $N_2$, $H_2$ at 500° C.-1000° C. for 3-7 hours. The fired product is wet milled, sieved, dehydrated, and dried, thereby obtaining the powder of the alkaline earth metal boric halide phosphor.

In the alkaline earth metal boric halide phosphor of $(M_{1-x-y}Eu_xM'_y)_2B_5O_9M''$ (where M is at least one selected from the group consisting of Mg, Ca, Ba, Sr, M' is a red luminescent activator and is at least one selected from the group consisting of Mn, Fe, Cr, Sn, $0.0001 \leq x \leq 0.5$, $0.0001 \leq y \leq 0.5$, and M'' is at least one halogen selected from the group consisting of F, Cl, Br, I), x which is the composition ratio of the first activator Eu is preferably set in a range of $0.0001 \leq x \leq 0.5$, since the luminescent brightness tends to lower when x is less than 0.0001 and the luminescent brightness tends to lower by concentration quenching when x is more than 0.5. The value of x is more preferably in a range of $0.005 \leq x \leq 0.4$, most preferably in a range of $0.01 \leq x \leq 0.2$. The value of y which is a composition ratio of at least one element of Mn, Fe, Cr, Sn is preferably set in a range of $0.0001 \leq y \leq 0.5$, more preferably in a range of $0.005 \leq y \leq 0.4$, most preferably in a range of $0.01 \leq y \leq 0.3$. The luminescent brightness is lowered by concentration quenching, when y is more than 0.5.

The phosphor 8 can show a luminescent color in a range of blue-white (for example, White in trivial color based on Japanese Industrial Standard (JIS) Z8110, or base white in the system color name diagram)-red by a excitation light in a range from the ultraviolet to relatively short wavelength side of the visible region (for example, the main wavelength of less than 440 nm).

Figure 6A:
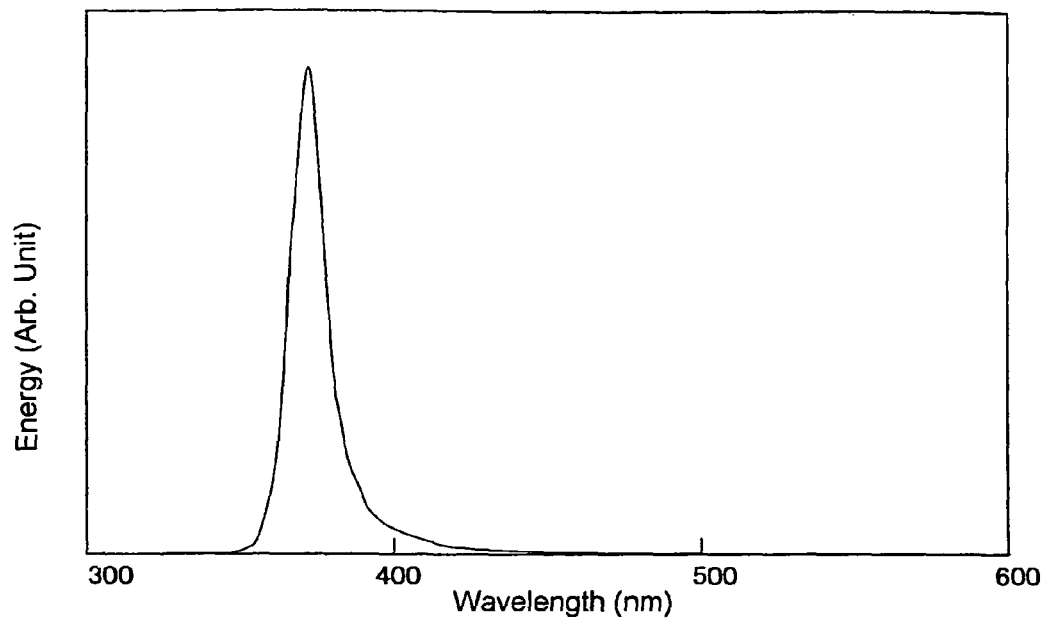
FIG. 6A and FIG. 6B are examples of luminescence spectra of the semiconductor light emitting elements used in the present invention.
Figure 6B:
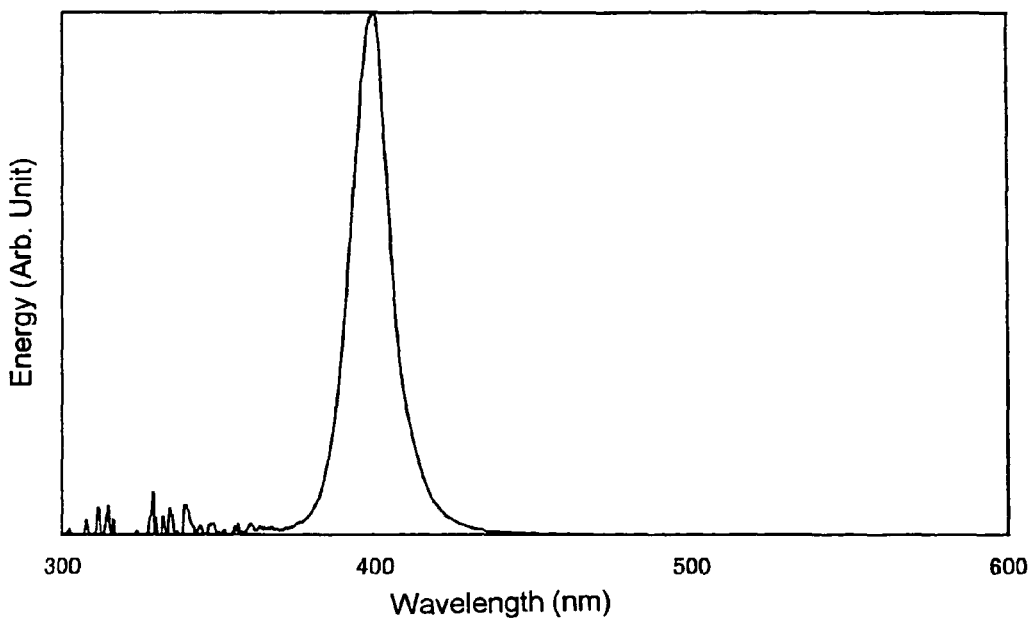

A general color rendering index Ra more than 90 can be obtained, since it can emit with high brightness efficiently by a short wavelength visible light or an ultraviolet light having a main wavelength of the relatively longer wavelength as shown in FIGS. 6A and 6B and red component is included sufficiently.

Figure 3:
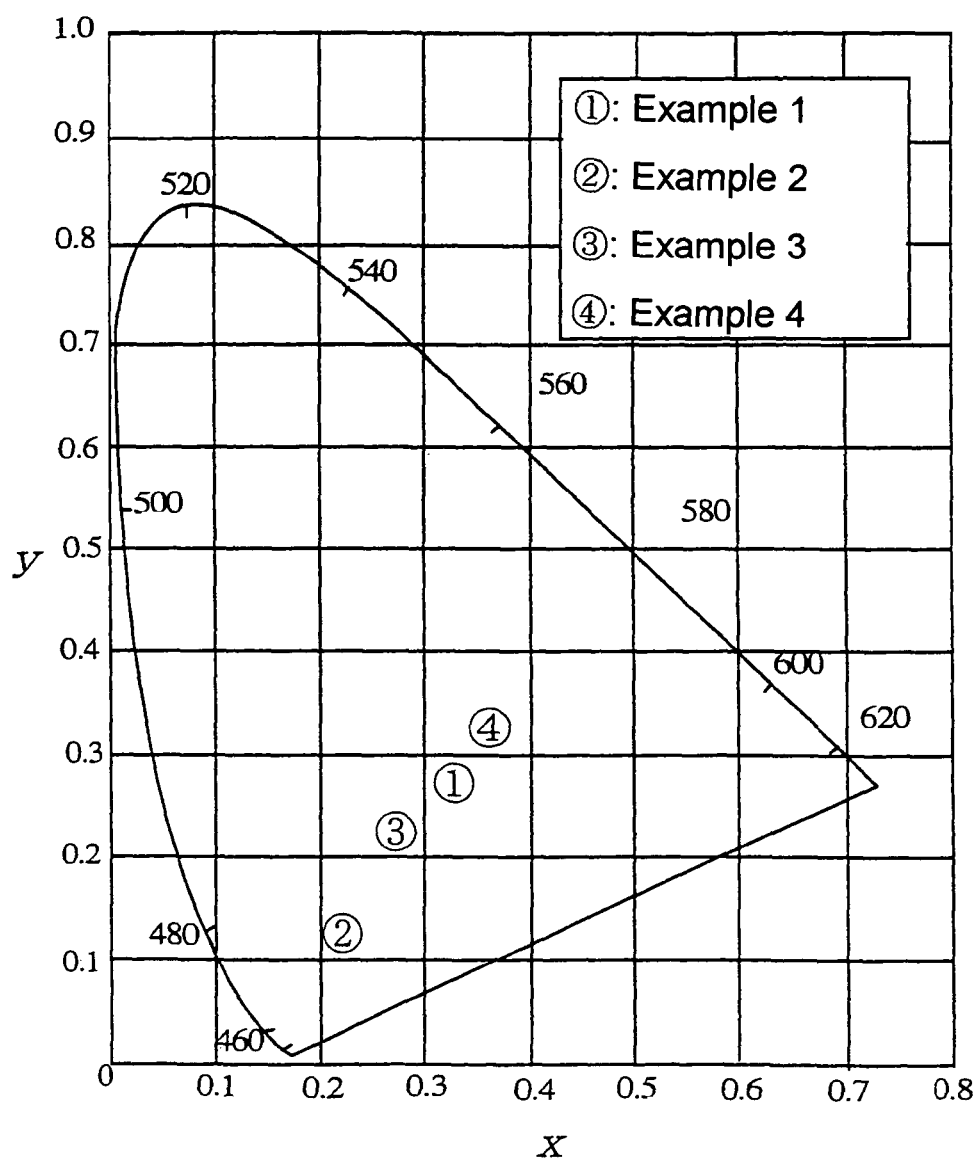
FIG. 3 is CIE chromaticity diagram showing the chromaticity of the phosphor used in the light emitting device of the present invention.

FIG. 3 is a CIE chromaticity diagram showing the luminescent color examples excited by 365.0 nm in the phosphors 8 used in the Examples 1 to 4 of the present invention. The diagram shows that the luminescent color of the light emitting device can be changed in a range of blue-white-red and the color tone can be adjusted by changing the composition ratio of the phosphor 8.

Although, when M is Sr, the phosphor emits a light of which luminescent color is blue by the luminescence of $Eu^{2+}$ having a peak in the vicinity of 450 nm, the luminescent color of the phosphor 8 shows a luminescent color in a range of blue-white-red by the red luminescence of Mn by increasing the value y in Mn of M'. When M is Ca, the change is the same with regard to the amount of Eu and Mn. However, when M is Ba, changing of the luminescent color is small.

Figure 4A:
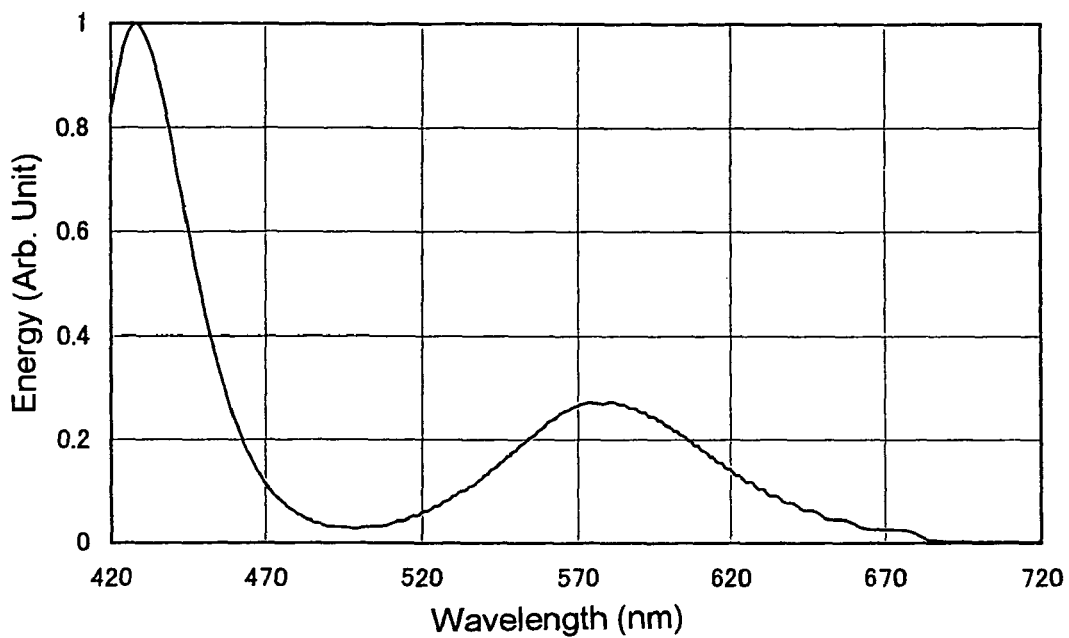
FIG. 4A is a luminescence spectrum diagram of the phosphor excited by the light having a wavelength of 400 nm in the Example 1.
Figure 5A:
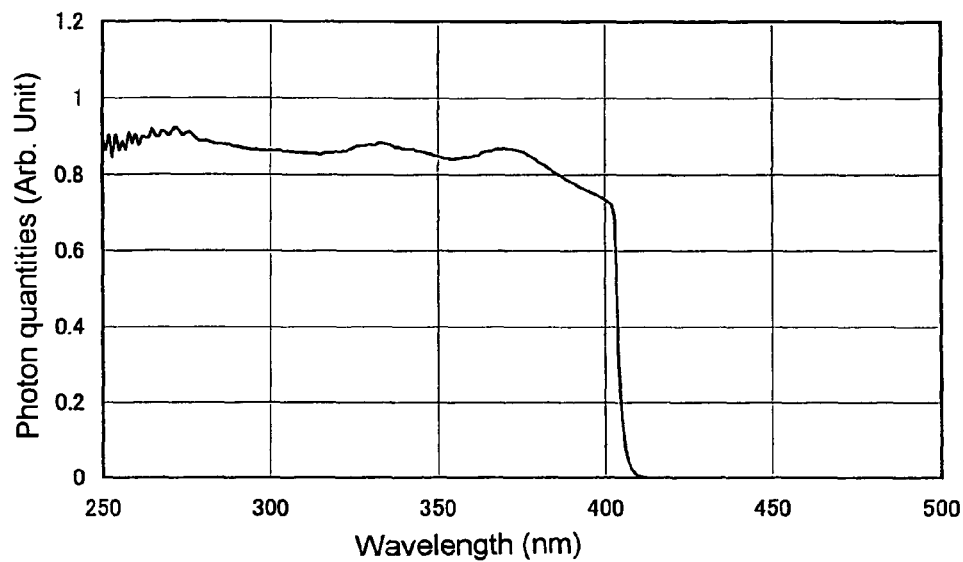
FIG. 5A is an excitation spectrum of the phosphor at the emitting wavelength of 455 nm in the Example 1.

FIG. 4A shows the luminescence spectrum of the phosphor 8 of Example 1 under the 400 nm excitation and FIG. 5A shows the excitation spectrum of the phosphor 8 of Example 1 in relation to the 455 nm emission. The similar excitation spectrum is obtained even in the case of the excitation by a 590 nm emission. The figures show that the phosphor 8 used in the present invention is excited efficiently by a light in a range from the longer side wavelength ultraviolet light to the shorter side wavelength (for example, from 250 nm to 425 nm) visible light and the luminescent color is included in the region of base white of JIS Z8110. Since the phosphor 8 is excited efficiently by any ultraviolet light, the phosphor 8 is expected to be effectively used for a short wavelength side ultraviolet light.

Figure 4B:
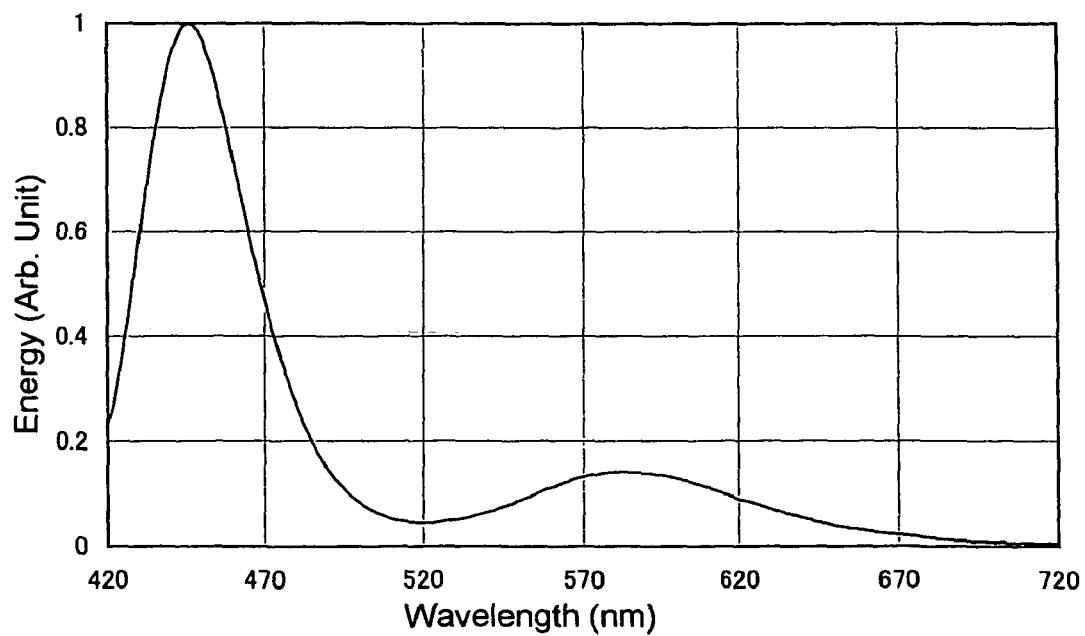
FIG. 4B is a luminescence spectrum diagram of the phosphor excited by the light having a wavelength of 400 nm in the Example 9.
Figure 5B:
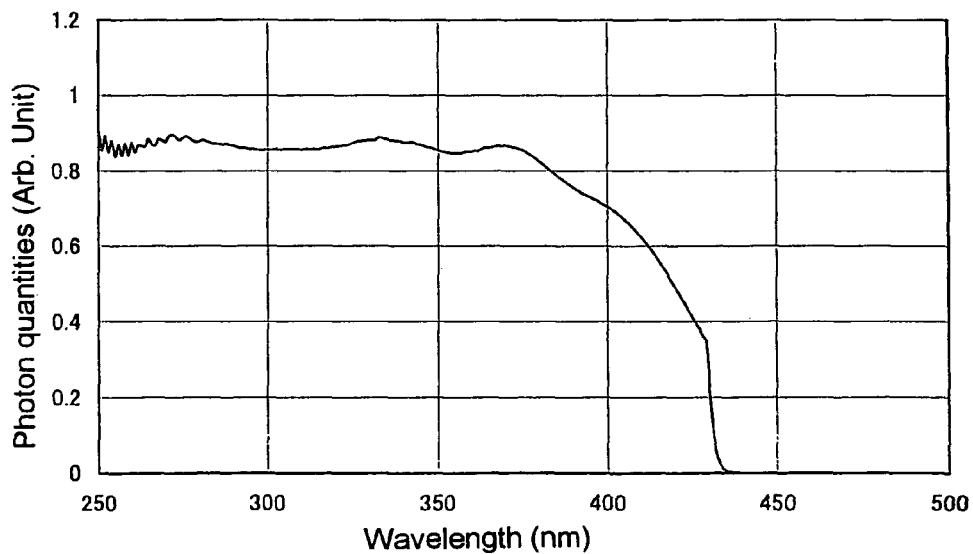
FIG. 5B is an excitation spectrum of the phosphor at the emitting wavelength of 455 nm in the Example 1.

FIG. 4B shows the luminescence spectrum of the phosphor 8 of Example 9 under the 400 nm excitation and FIG. 5B shows the excitation spectrum of the phosphor 8 of Example 9 in relation to 455 nm emission. The similar excitation spectrum is obtained even in the case of the excitation by 590 nm emission.

Furthermore, the phosphor 8 used in the light emitting device of the present invention may include an element selected from Tb, Cu, Ag, Au, Cr, Nd, Dy, Co, Ni, Ti and Pr with Eu according to need.

In the light emitting device of the present invention, a second phosphor having a luminescence spectrum different from the both spectra of the light emitting element and the first phosphor may be used in addition to the first phosphor which can be excited by at least an ultraviolet light emitted from the light emitting element and which is made by adding a red luminescent activator to the base material of a blue luminescent phosphor. The excitation source of the second phosphor may be the light emitting element or the first phosphor, or both of the light emitting element and the first phosphor. The second phosphor preferably emits a light between the blue region and the red region to provide the light emitting device capable of emitting the various kinds of neutral color.

The first phosphor and the second phosphor may be composed of one kind, or two or more kinds respectively. With this, since the combinations of the luminescent spectra enlarges infinitely, the light emitting device having a good color rendering property and high brightness can be obtained. In addition, when they are in relation of complementary color, a white light can be emitted efficiently. When the second phosphor is excited by the first phosphor and the first phosphor is composed of two or more kinds, it is not necessary that the all kinds of the first phosphor are excitation sources, the second phosphor may be excited by any of the first phosphor. When the first and the second phosphors are composed of not only one kind but also two or more kinds respectively, the first and the second phosphors can be made in relation of complementary color. With this, the light emitting device having a good color rendering property can be made. The color shading is improved as compared with the case that only one of the first and second phosphors is composed of two or more kinds and the complementary color is realized. For example, when the first phosphor is composed of two kinds and they are in relation of complimentary color, the total color tone is varied with time by losing the balance of the color tones by such as a thermal degradation of any of the phosphors. When the second phosphor is composed of two or more kinds and they are in relation of complimentary color, the total color tone is varied similarly.

Sapphire (aluminum oxide) phosphor activated by Eu and/or Cr, $CaO-Al_2O_3-SiO_2$ phosphor having nitrogen activated by Eu and/or Cr (oxynitride phosphor glass), and $M_xSi_yN_z$:Eu (where M is at least one element selected from the group consisting of Mg, Ca, Ba, Sr and Zn, z=2/3x+4/3y), which are phosphors that absorb a light in a range of blue-blue green-green and can emit a red light, are given for Examples of the second phosphor. With this, the luminescence having much red component and a good color rendering property can be obtained by the mixed color of the light emitted from the first phosphor and the light emitted from the second phosphor excited by the first phosphor. Such a white light having a good color rendering property preferably may be used for the lights of medical facilities, the flash lamps of copying machines and the like.

Yttrium aluminum oxide photoluminescence phosphors activated by Ce which are represented by the formula of $(Y_zGd_{1-z})_3Al_5O_{12}$:Ce($0<z\leq1$) and the formula of $(Re_{1-a}Sm_a)_3Re'_5O_{12}$:Ce($0\leq a<1$, $0\leq b\leq1$, Re is at least one element selected from the group consisting of Y, Gd, La and Sc, Re' is at least one element selected from the group consisting of Al, Ga and In), which absorb a light of blue-blue green-green and can emit a yellow light are given as other Examples of the second phosphor. Since the phosphors contain Gd (gadolinium) in the crystal, the excitation luminescence efficiency in the longer wavelength region more than 460 nm can be increased. The emission peak wavelength shifts to a longer wavelength with increasing the content of Gd. That is to say, a luminescent color having a large amount of red component can be obtained by increasing the amount of the substitution of Gd. Furthermore, Tb, Cu, Ag, Au, Fe, Cr, Nd, Dy, Co, Ni, Ti, Eu and Pr may be contained in addition to Ce if necessary.

In addition, the emission wavelength can be shifted to shorter wavelength side by substituting a part of Al by Ga in the composition of Yttrium aluminum garnet phosphor. Also the emission wavelength can be shifted to longer wavelength side by substituting a part of Y by Gd. When a part of Y is substituted by Gd, the substitution by Gd is preferably less than 10 percent and the content (substitution) ratio of Ce is preferably set in a range of 0.03 to 1.0. While a green component increases and a red component decreases in case that the substitution by Gd is less than 20 percent, the red component can be compensated by increasing the content of Ce and the desired color tone can be obtained without decreasing the brightness. With this composition, the temperature characteristic is improved and the reliability of the light emitting diode is improved. The light emitting device which can emit a neutral color light such as a pink can be obtained by using the photo luminescent phosphor adjusted so as to include much red component.

Such photo luminescent phosphors can be made by the following steps. As raw materials of Y, Gd, Al and Ce, the oxides or compounds which can easily transform to oxides at high temperature are prepared and mixed according to the stoichiometry to obtain the raw material. Alternately, the mixed raw material is made by mixing a coprecipitated oxide with aluminum oxide. The coprecipitated oxide is obtained by coprecipitating the solution made by solving the rare earth elements of Y, Gd and Ce in acid according to the stoichiometry with oxalic acid and firing. This raw material is mixed with fluoride such as barium fluoride and ammonium fluoride in moderation, placed in a crucible and fired at 1350-1450° C. for 2-5 hours. And then the fired product is wet crushed by ball mil, washed, separated, dried and sieved to obtain the photo luminescent phosphor.

In the light emitting device of the present invention, at least one phosphor selected from the group of;

an alkaline earth halogen apatite phosphor activated by Eu, or Eu and Mn($(Sr, Ca, Ba, Mg)_5(PO_4)_3(F, Cl, Br):Eu, Mn$), an alkaline earth metal aluminate phosphor ($SrAl_2O_4$:Eu, $Sr_4Al_{14}O_{25}$:EuMn, $CaAl_2O_4$:Eu(Mn), $BaMg_2Al_{16}O_{27}$:Eu, $BaMg_2Al_{16}O_{27}$:Eu,Mn, and $BaMgAl_{10}O_{17}$:Eu(Mn)), nitrogen-containing $CaO$—$Al_2O_3$—$SiO_2$ phosphor activated by Eu and/or Cr (oxynitride phosphor glass), $M_xSi_yN_z$:Eu (where M is at least one selected from Mg, Ca, Ba, Sr and Zn, $z=2/3x+4/3y$), a rare earth acid sulfide phosphor activated by Eu ($La_2O_2S$:Eu, $Y_2O_2S$:Eu, and $Gd_2O_2S$:Eu), an organic complex phosphor activated by Eu (($Sr, Ca, Ba, Mg)_5(PO_4)_3Cl$:Eu, $ZnS$:Cu, $Zn_2GeO_4$:Mn, $(Sr, Ca, Ba, Mg)Ga_2S_4$:Eu, and $(Sr, Ca, Ba, Mg)_2Si_5N_8$:Eu) may be used together with said photo luminescent phosphor. With this, the various desired luminescent colors can be obtained easily.

In the light emitting device of the present invention, when the plural phosphors are used, the phosphors mixed evenly may be arranged or the phosphors may be arranged so as to be laminated at every phosphor.

The particle size of the phosphor is preferably in a range of 1 μm-100 μm, more preferably in a range of 5 μm-50 μm, further preferably in a range of 10 μm-30 μm. The phosphor having a particle size less than 15 μm tend to cohere easily. The phosphor has a high absorption ratio and a high conversion efficiency of light and a broad excitation wavelength width by a particle size range. As described above, the light around the main wavelength of the light emitting element can be converted efficiently and can emit by including such large size phosphor particles having good optical properties. Therefore, the productivity of the light emitting device can be improved.

Here the particle size is a value obtained by a volume based particle size distribution curve. The volume based particle size distribution curve is obtained by measuring the particle size distribution by a laser diffraction-scattering method. Specifically, the volume based particle size distribution curve can be measured in a particle size range of 0.03 μm to 700 μm by dispersing each material in a sodium hexametaphosphate aqueous solution of 0.05% concentration under environments of 25° C. and humidity of 70%, using the laser diffraction type particle size distribution measuring apparatus (SALD-2000A). The median particle diameter is a particle size value at the integrated value of 50% in the volume based particle size distribution curve and the median particle diameter of the phosphor used in the present invention is preferably in a range of 15 μm-50 μm so as to obtain a high brightness. The phosphor particles having this median particle diameter are preferably contained with high frequency and the frequency value is preferably in a range of 20%-50%. Such phosphor particles having a small dispersion make it possible to provide the light emitting device having a restrained color shading and a good color tone.

The phosphor may be disposed at the various positions with relation to the position of the light emitting element. That is to say, the phosphor may be disposed directly on the emission surface of the light emitting element and may also be included in the die-bonding member for die-bonding the light emitting element on the package or in the mold member covering the light emitting element, and may be applied on the surfaces of the package or a lid which is a sealing member. As described above, the phosphor is applied to the light emitting element directly or indirectly.

In the light emitting device of the present invention, the phosphor can be adhered with various binders such as a resin which is an organic material and glass which is inorganic material.

When an organic material is used as a binder, transparent resins which are superior in antiweatherability, such as an epoxy resin, acryl resin, silicone resin, are preferably used. Especially, the silicone resin is preferably used, since the silicone resin improves a good dispersibility of the phosphor and has a good reliability. When an elastomeric or gelatinous member is used, the light emitting device having a high resistance against the thermal stress can be obtained.

An inorganic material may be used as a binder. The sedimentation method or the sol-gel method may be used as an actual example. For example, a phosphor, silanol ($Si(OEt)_3OH$) and ethanol are mixed to make a slurry. The slurry is jetted from the nozzle and then the slurry is heated at 300° C. for three hours to transform the silanol to $SiO_2$. With this, the phosphor is fixed at the desired place. Especially, when the phosphor is fixed on the window 7 of the lid, the inorganic material of which thermal extension ratio is similar to the window 7 is preferably used, since the phosphor can be adhered to the window firmly.

A binding agent of inorganic material may be used as a binder. The bond is a so-called low melting point glass. The low melting point glass is preferably fine particles and preferably has a small absorptivity to the radiation in a range from the ultraviolet region to the visible region and extremely stable in the binder. The alkaline earth borate fine particles made by sedimentation method are suitable for the particles.

When large sized phosphor particles are used, even if it has a high melting point, the binding agent of ultra-fine particles such as a silica, an alumina, a pyrophosphate and an orthophosphate of an alkaline earth metal made by sedimentation method is preferably used. These binding agents may be used individually or in combination.

Here, a coating method of the binding agent is described.

To heighten bonding effect, the slurry of the bond made by crushing the bonding material in a vehicle in wet is preferably used.

The vehicle is a high viscous solution made by solving a small amount of a binding material in an organic solvent or deionized water. For example, an organic vehicle can be made by solving 1 wt % of nitrocellulose in an organic solvent of butyl acetate.

The coating medium is made by adding the phosphor to the binding agent slurry. In the coating medium, an addition ratio of slurry may be set so that the amount of the bond in the slurry is about 1-3 wt % with respect to the phosphor. To prevent from lowering the luminous flux maintenance factor, the additional amount of the binding agent is preferably reduced. The coating medium is applied on the rear surface of the window. Then, the coating medium is dried by flowing of warm air or hot air. Finally, the vehicle is vaporized by baking at 400° C.-700° C. With this, the phosphor layer is fixed by the binding agent on the desired position.

<Dispersing Agent>

In the present invention, the color conversion member may include a dispersing agent together with the phosphor material. Barium titanate, Titanium oxide, Aluminum oxide, Silicon dioxide and soft or heavy calcium carbonate are preferably used as a dispersing agent. With this, the light emitting device having a desired directional pattern can be obtained.

In the present specification, the dispersing agents are particles having a center particle size of 1 nm or more but less than 5 µm. The dispersing agents having a center particle size of 1 µm or more but less than 5 µm reflect diffusely the light from the light emitting element and the phosphor efficiently and can control an irregular color caused by using large size phosphor particles. The half-width of the luminescent spectrum can be reduced and the light emitting device having a good color purity can be obtained. The dispersing agent of 1 nm or more but less than 1 µm has a high transparency and can enhance a viscosity of resin without decreasing the luminosity by high transparency, while the interference effect to the light wavelength of the light emitting element is small. When the color conversion material is disposed by potting etc., since the phosphor is dispersed almost uniformly in the resin in the syringe and can maintain that state, it is possible to produce with a good process yield even if the large sized phosphor particles which are hard to handle are used. As described above, the dispersing agents have different rolls corresponding to the particle size ranges respectively, so the dispersing agents can be used by selecting or combining according to the usage.

<Filler>

In the present invention, fillers may be included in the color conversion layer. The filler is similar to the dispersing agents in material and different from the dispersing agents in median particle diameter. In the specification, the fillers are particles of which center particle size is in a range of 5 µm-100 µm. When such particle sized fillers are included in the transparent resin, not only the chromaticity variation of the light emitting device is improved, but also a resistance for thermal shock can be improved. Therefore, the light emitting device having a good reliability prevented from breaking the wire and from exfoliating the light emitting element from the bottom of the recess can be obtained. Moreover, it is possible to maintain an even flowability of the resin for a long time and to form the sealing member in desired position, and thereby making it possible to produce with a good process yield.

The fillers preferably have a particle size and/or a shape similar to the phosphor particles. In the present invention, similar particle sizes mean that the difference between those center particle sizes is less than 20%. The similar shapes mean that the difference between circularity which is a degree of approximation to the perfect circle is less than 20% (The "circularity" is defined as the length of the circumference of the perfect circle having an area equal to the projected area of the particle/the length of the circumference of the projection of the particle"). When such fillers are used, the phosphor and the fillers interact with one another and the phosphor particles can be well dispersed in the resin, and thereby control an irregular color. Moreover, the phosphor and the fillers preferably have particle sizes in a range of 15 µm-50 µm, more preferably in a range of 20 µm-50 µm. By this particle size, the particles can be arranged with desired distances between the particles. With this, the routes for outputting the light can be secured sufficiently, so the directional pattern can be improved without decreasing the luminous intensity.

The invention will be understood in detail with reference to the following examples. However, these examples are not to be construed to limit the scope of the invention.

EXAMPLE 1

The light emitting device of surface mounting type shown in FIG. 2 is made. The LED chip 1 is a nitride semiconductor element having a light emitting layer made of InAlGaN semiconductor of which peak wavelength is 400 nm of ultraviolet light.

More concretely, the LED chip 1 can be formed by depositing the nitride semiconductors on a washed sapphire substrate by MOCVD method using TMG (trimethyl-gallium) gas, TMI (trimethyl-indium) gas, nitrogen gas and dopant gas together with carrier gas. A layer to be the n-type nitride semiconductor and A layer to be the p-type nitride semiconductor can be made by changing between $SiH_4$ and $Cp_2Mg$ as a dopant gas.

The LED chip 1 has an element structure constituted by laminating an n-type GaN layer of undoped nitride semiconductor, an Si doped GaN layer which is an n-type contact layer to be formed with an n-type electrode, an n-type GaN layer of undoped nitride semiconductor, an AlGaN layer including Si which is an n-type cladding layer and a light emitting layer in order on a sapphire substrate. The light emitting layer has a multiple quantum well structure made by laminating five sets each of which is composed of an AlInGaN layer to be a well layer and an AlInGaN layer to be a barrier layer including Al more than the well layer. A Mg-doped AlGaN layer for a p-type cladding layer, a GaN layer for improving the electrostatic discharge tolerance and a Mg-doped GaN layer for a p-type contact layer are laminated in order on the light emitting layer. (A buffer layer of GaN grown at a lower temperature is formed on the sapphire substrate. And p-type semiconductors are annealed at 400° C. or more after growth.)

In detail, after a buffer layer of GaN is grown at a thickness of 200 Å at 500° C. on a 2 inches diameter sapphire substrate having a main plane of a (0001) C plane, a temperature is risen to 1050° C. and then an undoped GaN layer is grown at a thickness of 5 µm. Although the thickness is not limited at 5 µm, it is preferable that the thickness is more than the thickness of the buffer layer and not exceeding 10 µm. Next, after growing the undoped GaN layer, the wafer is taken out from the reactor. Then, stripe shaped photo masks are formed on the surface of the undoped GaN layer and masks of $SiO_2$ having 15 µm stripe widths are formed at 5 µm intervals (window portions) at 0.1 µm thickness by a CVD apparatus. After the masks are formed, the wafer is taken in the reactor again and an undoped GaN layer is grown at 1050° C. at 10 µm thickness. Although, the crystal defect density of the undoped GaN layer is more than $10^{10}/cm^2$ or more, the crystal defect density of the GaN layer is more than $10^6/cm^2$ or more.

Next, the n-type contact layer and n-type Gallium nitride compound semiconductor layer are formed. First, the n-type contact layer doped with Si at $4.5\times10^{18}/cm^3$ is grown at 1050° C. at the thickness of 2.25 µm using source gases of TMG, ammonia gas, silane gas for impurity gas. Next, only the silane gas is stopped and the undoped GaN layer is grown at the thickness of 75 Å using TMG and ammonia gas. Successively, the silane gas is flowed again and the GaN layer doped with Si at $4.5\times10^{18}/cm^3$ is grown at the same temperature at the thickness of 25 Å. With this, a pair of A layer of the undoped GaN layer of 75 Å thickness and B layer of the GaN layer doped with Si of 25 Å thickness is grown. The n-type Gallium nitride compound semiconductor layer of multilayer film having a super lattice structure is grown at 2500 Å thickness by laminating the pairs 25 times.

Next, a barrier layer of undoped GaN is grown at 250 Å thickness. Successively, after the temperature is changed to 800° C., a well layer of undoped InGaN is grown at 30 Å thickness using TMG, TMI, ammonia. The active layer having a multiple quantum well structure and the total thickness of 1930 Å is grown by laminating seven barrier layers and six well layers alternately in order of Barrier+Well+Barrier+Well+ . . . +Barrier.

Next, the p-type layers including a p-side multilayer film cladding layer and p-type contact layer are formed. First, a third nitride semiconductor layer of p-type $Al_{0.2}Ga_{0.8}N$ doped with Mg at $1\times10^{20}/cm^3$ is grown at 1050° C. at the thickness of 40 Å using TMG, TMA, ammonia, $Cp_2Mg$ (cyclopentadienyl magnesium). Successively, the temperature is set at 800° C. and then a fourth nitride semiconductor layer of $In_{0.03}Ga_{0.97}N$ doped with Mg at $1\times10^{20}/cm^3$ is grown at the thickness of 25 Å using TMG, TMI, ammonia, $Cp_2Mg$. The five third nitride semiconductor layers and the five fourth nitride semiconductor layers are laminated alternately by repeating these growth processes and finally the third nitride semiconductor layer is grown at the thickness of 40 Å. With this, a p-side multilayer film cladding layer which is a multilayer film of super lattice structure having a total thickness of 365 Å is grown. Next, the p-side contact layer of p-type GaN doped with Mg at $1\times10^{20}/cm^3$ is grown at 1050° C. at the thickness of 700 Å using TMG, ammonia, $Cp_2Mg$.

After reaction, the temperature is lowered to the room temperature and then the wafer is annealed in the reactor at 700° C. at a nitride atmosphere, thereby furthermore lowering the resistances of the p-type layers.

Next, the surfaces of the p and n-contact layers are exposed on a same side of the sapphire substrate by etching. Concretely, the wafer is taken out from the reactor and then a mask is formed on the surface in a predetermined shape. Next, the surface of the n-type contact layer is exposed by etching from the p-type gallium nitride compound semiconductor layer side using an RIE (reactive ion etching) apparatus.

Each of the anode and cathode pad electrodes is formed on the surface of each contact layer by sputtering respectively. After a metal thin film is formed on the all of the surface of the p-type nitride semiconductor as a transparent electrode, the pad electrode is formed on the part of the transparent electrode. Concretely, after etching, the transparent p-electrode (Ni/Au=60 Å/50 Å) having a 110 Å thickness is formed so as to cover nearly all surface of the p-type layer and then the pad electrode having three extended conducting line parts is formed with Au at 0.5 μm thickness along with an edge of a corner of the light emitting device on the transparent p-type electrode. On the other hand, an n-electrode including W and Al is formed opposite to the pad electrode on the surface of n-contact layer exposed by etching. The prepared semiconductor wafer is scribed and is divided by an external force, thereby forming LED chips 1.

On the other hand, Iron package 5 is used as a case of the light emitting device. The iron package 5 has a thin portion in recess shape at the center thereof and a thick portion elongated from the thin portion to edge and the thick portion has lead electrode pins 3 penetrated in the through holes formed at the thick portion so as to be sealed and insulated by glass 2. The iron package has support parts 14 at the positions symmetric to the lead electrode pins with the recess between them of the bottom surface side. The support parts can be easily formed by pressing on the side of the main surface of the iron package. With this, the stability of the package is improved, so a good optical property can be obtained. The surfaces of the lead electrode pins 3 are plated with Ni/Ag layer.

The LED chip 1 is die-bonded with Ag—Sn alloy in the recess of the package constituted as described above. Next, each electrode of the die-bonded LED chip 1 and each electrode pin 3 exposed on the bottom surface of the recess of the package are electrically bonded with Ag wire 4.

$SrCO_3$, $H_3BO_3$, $Eu_2O_3$, $MnCO_3$ and $NH_4Cl$ are used as raw materials of the phosphor, they are weighed in the ratio according to the composition of $(Sr_{0.90},Eu_{0.05},Mn_{0.05})_2B_5O_9Cl$ and Mixed. Where, content of NH4Cl is preferably set twice as large as the composition ($SrCO_3$:265.7 g, $H_3BO_3$: 309.1 g, $Eu_2O_3$:17.6 g, $MnCO_3$:11.5 g$NH_4Cl$:106.9 g).

The weighed raw materials are fully mixed in dry by a mixing machine such as a ball mil. The mixed raw materials are filled in a crucible of such as SiC, quartz or alumina and then the temperature is raised to 1000° C. at the rate of 500° C./hour and maintained at the constant temperature stage of 1000° C. for three hours in the reduced atmosphere of $N_2$, $H_2$. The fired product is wet crushed, dispersed, sieved, separated, washed, and dried, thereby obtaining the phosphor 8.

A solution made by mixing the obtained phosphor 8, an ethyl silicate sol and ethylene glycol in the ratio of 1:1:1 by weight is agitated to be adjusted, thereby obtaining a coating medium and the coating medium is spray-coated on the surface of the LED chip 1 and inner wall of the recess of the package 5, while setting the package 5 provided with the LED chip 1 on a heater set at 200° C. The color conversion layer is formed by heat drying at 300° C. for three hours after once left at the room temperature.

Next, the moisture content is exhausted fully from the recess and then the recess is sealed with the covar lid 6 having a glass window 7 at the center thereof by seam welding. The light emitting device composed as described above has a good heat release characteristic and a high light resistance to near ultraviolet and ultraviolet light, since all of the parts of the light emitting device are made of inorganic materials.

The chromaticity coordinates of the light emitting device can be made (x,y)=(0.329,0.271). The luminescent efficiency is 25.2 m/W at the driving condition of 20 mA. In the light emitting device by 400 nm excitation according to Example 2, the luminescent brightness is 217% when the luminescent brightness of the light emitting device of comparative sample 1 is regarded as 100%. In the light emitting device having the light emitting element which emits the excitation light of 365 nm, the chromaticity coordinate(x,y)=(0.330,0.272) can be obtained and the luminescent brightness is about 147%.

COMPARATIVE EXAMPLE 1

The light emitting device of Comparative sample 1 is made similar to Example 1 except that a phosphor which is made by mixing $BaMg_2Al_{16}O_{27}$:Eu of a blue luminescence color, $BaMg_2Al_{16}O_{27}$:Eu, Mn of a green luminescence color and $Y_2O_2S$:Eu of a red luminescence color so as to have the chromaticity equal to Example 1 to obtain the same chromaticity is used instead of all of the phosphor of the present invention.

EXAMPLE 2

The light emitting device is made similar to Example 1 except that the raw materials of $SrCO_3$, $MnCO_3$ and $Eu_2O_3$ are adjusted and mixed according to the composition ratio $(Sr_{0.94}, Eu_{0.05}, Mn_{0.01})_2B_5O_9Cl$ by changing the ratio in the phosphor of Example 1, thereby obtaining the color tone of the chromaticity coordinates(x,y)=(0.210,0.103). Moreover, the luminous efficiency is 23.9 lm/W at the drive condition of 20 mA. If the luminescent brightness of comparative example 1 is regarded as 100%, the luminescent brightness is about 206% in the light emitting device excited by 400 nm according to Example 2. In the light emitting device excited by 365 nm, the chromaticity coordinates (x,y)=(0.211,0.105) can be obtained and the luminescent brightness is about 139%.

EXAMPLE 3

The light emitting device is made similar to Example 1 except that the raw materials of $SrCO_3$, $MnCO_3$ and $Eu_2O_3$ are adjusted and mixed according to the composition ratio of $(Sr_{0.92}, Eu_{0.05}, Mn_{0.03})_2B_5O_9Cl$ by changing the ratio in the phosphor of Example 1, thereby obtaining the color tone of the chromaticity coordinates(x,y)=(0.284,0.210) can be obtained. Moreover, the luminous efficiency is 24.7 lm/W at the drive condition of 20 mA. If the luminescent brightness of comparative example 1 is regarded as 100%, the luminescent brightness is about 213% in the light emitting device excited by 400 nm according to Example 2. In the light emitting device excited by 365 nm, the chromaticity coordinates(x,y)=(0.285,0.212) can be obtained and the luminescent brightness is about 144%.

EXAMPLE 4

The light emitting device is made similar to Example 1 except that the raw materials of $SrCO_3$, $MnCO_3$ and $Eu_2O_3$ are adjusted and mixed according to the composition ratio of $(Sr_{0.85}, Eu_{0.05}, Mn_{0.10})_2B_5O_9Cl$ by changing the ratio in the phosphor of Example 1, thereby obtaining the color tone of the chromaticity coordinates(x,y)=(0.374,0.321). Moreover, the luminous efficiency is 26.1 lm/W at the drive condition of 20 mA. If the luminescent brightness of comparative example 1 is regarded as 100%, the luminescent brightness is about 225% in the light emitting device excited by 400 nm according to Example 4. In the light emitting device excited by 365 nm, the chromaticity coordinates(x y)=(0.375 0.323) can be obtained and the luminescent brightness is about 148%.

EXAMPLE 5

The light emitting device is made similar to Example 1 except that the raw materials of $SrCO_3$, $MnCO_3$ and $Eu_2O_3$ are adjusted and mixed according to the composition ratio of $(Sr_{0.92}, Eu_{0.03}, Mn_{0.05})_2B_5O_9Cl$ by changing the ratio in the phosphor of Example 1, thereby obtaining the color tone of the chromaticity coordinates(x,y)=(0.314,0.263). Moreover, luminous efficiency is 24.4 lm/W at the drive condition of 20 mA. If the luminescent brightness of comparative example 1 is regarded as 100%, the luminescent brightness is about 210% in the light emitting device excited by 400 nm according to Example 5. In the light emitting device excited by 365 nm, the chromaticity coordinates (x, y)=(0.315, 0.265) can be obtained and the luminescent brightness is about 140%.

EXAMPLE 6

The light emitting device is made similar to Example 1 except that the raw materials of $SrCO_3$, $MnCO_3$ and $Eu_2O_3$ are adjusted and mixed according to the composition ratio of $(Sr_{0.85}, Eu_{0.10}, Mn_{0.05})_2B_5O_9Cl$ by changing the ratio in the phosphor of Example 1, thereby obtaining the color tone of which chromaticity coordinates (x, y)=(0.337, 0.278). Moreover, the luminous efficiency is 25.8 lm/W at the drive condition of 20 mA. If the luminescent brightness of comparative example 1 is regarded as 100%, the luminescent brightness is about 222% in the light emitting device of 400 nm excitation of Example 6. In the light emitting device excited by 365 nm, the chromaticity coordinates (x,y)=(0.338,0.280) can be obtained and the luminescent brightness is about 150%.

EXAMPLE 7

The raw materials of $CaCO_3$, $H_3BO_3$, $Eu_2O_3$, $MnCO_3$ and $NH_4Cl$ are weighted in the ratio according to the composition of $(Ca_{0.90}, Eu_{0.05}, Mn_{0.05})_2B_5O_9Cl$ and mixed.
$CaCO_3$:180.1 g,
$H_3BO_3$:309.1 g,
$Eu_2O_3$:17.6 g,
$MnCO_3$:11.5 g,
$NH_4Cl$:106.9 g, The raw materials are weighed and fully mixed in the dry process by a mixing machine such as a ball mil. The mixed raw materials are filled in a crucible of such as SiC, quartz or alumina and then the temperature is raised to 1000° C. at the rate of 500° C./hour and maintained at the constant temperature stage of 1000° C. for three hours in a reduction atmosphere of $N_2$, $H_2$. The fired product is wet crushed, dispersed, sieved, separated, washed, and dried, thereby obtaining the desired phosphor powder.

The light emitting device of Example 7 is made similar to Example 1 except that this phosphor is used, thereby obtaining the color tone of the chromaticity coordinates(x y)= (0.318, 0.247). Moreover, luminous efficiency is 23.5 lm/W at the drive condition of 20 mA. If the luminescent brightness of comparative example 1 is regarded as 100%, the luminescent brightness is about 202% in the light emitting device excited by 400 nm according to Example 7. In the light emitting device excited by 365 nm, the chromaticity coordinates(x,y)=(0.320,0.250) can be obtained and the luminescent brightness is about 132%.

Although in this example $CaCO_3$ is used instead of $SrCO_3$ in Example 1 as a raw material of the phosphor, when $MgCO_3$ is used instead of $SrCO_3$ in Example 1 as a raw material, the phosphor of $(Mg_{0.90}, Eu_{0.05}, Mn_{0.05})_2B_5O_9Cl$ can be obtained by the same processes described above and can be used similarly in a light emitting device.

EXAMPLE 8

The light emitting device is made similar to Example 7 except that the raw materials of $CaCO_3$, $MnCO_3$ and $Eu_2O_3$ are adjusted and mixed according to the composition ratio of $(Ca_{0.94}, Eu_{0.05}, Mn_{0.01})_2B_5O_9Cl$ by changing the ratio in the phosphor of Example 7, thereby obtaining the color tone of the chromaticity coordinates(x,y)=(0.190,0.091). Moreover, luminous efficiency is 21.8 lm/W at the drive condition of 20 mA. If the luminescent brightness of comparative example 1 is regarded as 100%, the luminescent brightness is about 188% in the light emitting device excited by 400 nm according to Example 8. In the light emitting device excited by 365 nm, the chromaticity coordinates (x, y)=(0.191, 0.092) can be obtained and the luminescent brightness is about 124%.

EXAMPLE 9

The light emitting device is made similar to Example 7 except that the raw materials of $CaCO_3$, $MnCO_3$ and $Eu_2O_3$ are adjusted and mixed according to the composition ratio of $(Ca_{0.92}, Eu_{0.05}, Mn_{0.03})_2B_5O_9Cl$ by changing the ratio in the phosphor of Example 7, thereby obtaining the color tone of which chromaticity coordinates (x, y)=(0.263, 0.193). Moreover, the luminous efficiency is 22.9 lm/W at the drive condition of 20 mA. If the luminescent brightness of comparative example 1 is regarded as 100%, the luminescent brightness is about 197% in the light emitting device excited by 400 nm according to Example 9. In the light emitting device of 365 nm excitation, the chromaticity coordinates (x, y)=(0.265, 0.195) can be obtained and the luminescent brightness is about 139%.

EXAMPLE 10

The light emitting device is made similar to Example 7 except that the raw materials of $CaCO_3$, $MnCO_3$ and $Eu_2O_3$ are adjusted and mixed according to the composition ratio of $(Ca_{0.85}, Eu_{0.05}, Mn_{0.10})_2B_5O_9Cl$ by changing the ratio in the phosphor of Example 7, thereby obtaining the color tone of the chromaticity coordinates (x,y)=(0.352,0.300). Moreover, the luminous efficiency is 23.3 lm/W at the drive condition of 20 mA. If the luminescent brightness of comparative example 1 is regarded as 100%, the luminescent brightness is about 201% in the light emitting device excited by 400 nm according to Example 10. In the light emitting device excited by 365 nm, the chromaticity coordinates (x, y)=(0.355, 0.302) can be obtained and the luminescent brightness is about 133%.

EXAMPLE 11

The light emitting device is made similar to Example 7 except that the raw materials of $CaCO_3$, $MnCO_3$ and $Eu_2O_3$ are adjusted and mixed according to the composition ratio of $(Ca_{0.92}, Eu_{0.03}, Mn_{0.05})_2B_5O_9Cl$ by changing the ratio in the phosphor of Example 7, thereby obtaining the color tone of the chromaticity coordinates (x,y)=(0.293,0.241). Moreover, the luminous efficiency is 22.2 lm/W at the drive condition of 20 mA. If the luminescent brightness of comparative example 1 is regarded as 100%, the luminescent brightness is about 191% in the light emitting device excited by 400 nm according of Example 11. In the light emitting device excited by 365 nm, the chromaticity coordinates (x, y)=(0.295, 0.243) can be obtained and the luminescent brightness is 128%.

EXAMPLE 12

The light emitting device is made similar to Example 7 except that the raw materials of $CaCO_3$, $MnCO_3$ and $Eu_2O_3$ are adjusted and mixed according to the composition ratio of $(Ca_{0.85}, Eu_{0.10}, Mn_{0.05})_2B_5O_9Cl$ by changing the ratio in the phosphor of Example 7, thereby obtaining the color tone of chromaticity coordinates(x,y)=(0.326,0.252). Moreover, the luminous efficiency is 23.8 lm/W at the drive condition of 20 mA. If the luminescent brightness of comparative example 1 is regarded as 100%, the luminescent brightness is about 205% in the light emitting device excited by 400 nm of Example 12. In the light emitting device excited by 365 nm, the chromaticity coordinates(x,y)=(0.328,0.255) can be obtained and the luminescent brightness is about 136%.

EXAMPLE 13

The raw materials of $BaCO_3$, $H_3BO_3$, $Eu_2O_3$, $MnCO_3$ and $NH_4Cl$ are weighted in the ratio according to $(Ba_{0.90}, Eu_{0.05}, Mn_{0.05})_2B_5O_9Cl$ and mixed.

$BaCO_3$:355.2 g,
$H_3BO_3$:309.1 g,
$Eu_2O_3$:17.6 g,
$MnCO_3$:11.5 g,
$NH_4Cl$:106.9 g,

The raw materials are weighed and fully mixed in dry process by a mixing machine such as a ball mil. The mixed raw materials are filled in a crucible of such as SiC, quartz or alumina and then the temperature is raised to 900° C. at the rate of 500° C./hour and maintained at the constant temperature stage of 900° C. for three hours in a reduction atmosphere of $N_2$, $H_2$. The fired product is wet crushed, dispersed, sieved, separated, washed and dried, thereby obtaining the desired phosphor powder.

The light emitting device of Example 13 is made similar to Example 1 except that this phosphor is used, thereby obtaining the color tone of the chromaticity coordinates(x,y)=(0.362,0.284). Moreover, the luminous efficiency is 16.8 lm/W at the drive condition of 20 mA. If the luminescent brightness of comparative example 1 is regarded as 100%, the luminescent brightness is about 145% in the light emitting device excited by 400 nm according to Example 13. In the light emitting device of 365 nm excitation, the chromaticity coordinates(x,y)=(0.365,0.287) can be obtained and the luminescent brightness is about 95%.

EXAMPLE 14

The raw materials of $SrCO_3$, $BaCO_3$, $CaCO_3$, $H_3BO_3$, $Eu_2O_3$, $MnCO_3$ and $NH_4Cl$ are weighted in the ratio according to $(Sr_{0.60},Ba_{0.10},Ca_{0.20},Eu_{0.05},Mn_{0.05})_2B_5O_9Cl$ and mixed.

$SrCO_3$: 177.1 g,
$BaCO_3$:39.5 g,
$CaCO_3$:40.4 g
$H_3BO_3$:309.1 g,
$Eu_2O_3$: 17.6 g,
$MnCO_3$:11.5 g,
$NH_4Cl$:106.9 g,

The raw materials are weighed and fully mixed by a mixing machine such as a ball mil in the dry process. The mixed raw materials are filled in a crucible of such as SiC, quartz or alumina and then the temperature is raised to 1000° C. at the rate of 500° C./hour and maintained at the constant temperature stage of 1000° C. for three hours in a reduction atmosphere of $N_2$, $H_2$. The fired product is wet crushed, dispersed, sieved, separated, washed, and dried, thereby obtaining the phosphor powder.

The light emitting device of Example 14 is made similar to Example 1 except that this phosphor is used, thereby obtaining the color tone of the chromaticity coordinates(x,y)=(0.324,0.262). Moreover, the luminous efficiency is 24.3 lm/W at the drive condition of 20 mA. If the luminescent brightness of comparative example 1 is regarded as 100%, the luminescent brightness is about 209% in the light emitting device excited by 400 nm according to Example 14. In the light emitting device excited by 365 nm, the chromaticity coordinates(x,y)=(0.325,0.265) can be obtained and the luminescent brightness is about 141%.

Although in this Example three elements of Sr, Ba and Ca are selected as M of $(M_{1-x-y}Eu_xM'_y)_2B_5O_9M''$, the selection number and selected elements are not restricted to these. That is to say, at least one element may be selected from the group of Mg, Ca, Ba and Sr. When any element is chosen, a light emitting device can be formed by a manner similar to this Example.

EXAMPLE 15

The light emitting device is made similar to Example 14 except that the raw materials of $SrCO_3$, $MnCO_3$ and $Eu_2O_3$ are adjusted and mixed according to the composition ratio of $(Sr_{0.64},Ba_{0.10},Ca_{0.20}, Eu_{0.05}, Mn_{0.01})_2B_5O_9Cl$ by changing the ratio in the phosphor of Example 14, thereby obtaining the color tone of chromaticity coordinates (x,y)=(0.203,0.097). Moreover, the luminous efficiency is 22.3 lm/W at the drive condition of 20 mA. If the luminescent brightness of comparative example 1 is regarded as 100%, the luminescent brightness is about 192% in the light emitting device excited by 400 nm according to Example 15. In the light emitting device excited by 365 nm, the chromaticity coordinates(x,y)=(0.204,0.098) can be obtained and the luminescent brightness is about 134%.

EXAMPLE 16

The light emitting device is made similar to Example 14 except that the raw materials of $SrCO_3$, $MnCO_3$ and $Eu_2O_3$ are adjusted and mixed according to the composition ratio of $(Sr_{0.62},Ba_{0.10},Ca_{0.20}, Eu_{0.05}, Mn_{0.03})_2B_5O_9Cl$ by changing the ratio in the phosphor of Example 14, thereby obtaining the color tone of the chromaticity coordinates(x,y)=(0.276, 0.201). Moreover, the luminous efficiency is 23.7 lm/W at the drive condition of 20 mA. If the luminescent brightness of comparative example 1 is regarded as 100%, the luminescent brightness is about 204% in the light emitting device excited 400 nm according to Example 16. In the light emitting device excited by 365 nm, the chromaticity coordinates(x,y)=(0.278, 0.203) can be obtained and the luminescent brightness is about 139%.

EXAMPLE 17

The light emitting device is made similar to Example 14 except that the raw materials of $SrCO_3$, $MnCO_3$ and $Eu_2O_3$ are adjusted and mixed according to the composition ratio of $(Sr_{0.55},Ba_{0.10},Ca_{0.20}, Eu_{0.05}, Mn_{0.10})_2B_5O_9Cl$ by changing the ratio in the phosphor of Example 14, thereby obtaining the color tone of which chromaticity coordinates(x,y)=(0.363, 0.313). Moreover, the luminous efficiency is 25.2 lm/W at the drive condition of 20 mA. If the luminescent brightness of comparative example 1 is regarded as 100%, the luminescent brightness is about 217% in the light emitting device excited by 400 nm according to Example 17. In the light emitting device excited by 365 nm, the chromaticity coordinates(x,y)=(0.365,0.316) can be obtained and the luminescent brightness is about 143%.

EXAMPLE 18

The light emitting device is made similar to Example 14 except that the raw materials of $SrCO_3$, $MnCO_3$ and $Eu_2O_3$ are adjusted and mixed according to the composition ratio of $(Sr_{0.62},Ba_{0.10},Ca_{0.20}, Eu_{0.03}, Mn_{0.05})_2B_5O_9Cl$ by changing the ratio in the phosphor of Example 14, thereby the color tone of the chromaticity coordinates(x,y)=(0.317,0.256). Moreover, the luminous efficiency is 23.0 lm/W at the drive condition of 20 mA. If the luminescent brightness of comparative example 1 is regarded as 100%, the luminescent brightness is about 198% in the light emitting device excited by 400 nm excitation according to Example 18. In the light emitting device excited by 365 nm, the chromaticity coordinates(x,y)=(0.319,0.258) can be obtained and the luminescent brightness is about 131%.

EXAMPLE 19

The light emitting device is made similar to Example 14 except that the raw materials of $SrCO_3$, $MnCO_3$ and $Eu_2O_3$ are adjusted and mixed according to the composition ratio of $(Sr_{0.55},Ba_{0.10},Ca_{0.20}, Eu_{0.10}, Mn_{0.05})_2B_5O_9Cl$ by changing the ratio in the phosphor of Example 14, thereby obtaining the color tone of the chromaticity coordinates(x,y)=(0.328, 0.269). Moreover, the luminous efficiency is 25.0 lm/W at the drive condition of 20 mA. If the luminescent brightness of comparative example 1 is regarded as 100%, the luminescent brightness is about 215% in the light emitting device excited by 400 nm according to Example 19. In the light emitting device excited by 365 nm, the chromaticity coordinates(x,y)=(0.330,0.272) can be obtained and the luminescent brightness is about 144%.

EXAMPLE 20

The light emitting device is made similar to Example 14 except that $SnO_2$ is used as a raw material together with the raw materials of $SrCO_3$, $BaCO_3$, $CaCO_3$, $H_3BO_3$, $Eu_2O_3$, $MnCO_3$ and $NH_4Cl$ and they are adjusted in the ratio according to $(Sr_{0.59},Ba_{0.10},Ca_{0.20}, Eu_{0.05}, Mn_{0.05},Sn_{0.01})_2B_5O_9Cl$ and mixed in the phosphor of Example 14, thereby obtaining the color tone of the chromaticity coordinates(x,y)=(0.322, 0.261). Moreover, the luminous efficiency is 21.8 lm/W at the drive condition of 20 mA. If the luminescent brightness of comparative example 1 is regarded as 100%, the luminescent brightness is about 188% in the light emitting device excited by 400 nm according Example 19. In the light emitting device excited by 365 nm, the chromaticity coordinates(x y)=(0.324, 0.263) can be obtained and the luminescent brightness is about 133%.

EXAMPLE 21

The light emitting device is made similar to Example 14 except that $Fe_2O_3$ is used as a raw material together with the raw materials of $SrCO_3$, $BaCO_3$, $CaCO_3$, $H_3BO_3$, $Eu_2O_3$, $MnCO_3$ and $NH_4Cl$ and they are adjusted in the ratio according to $(Sr_{0.59},Ba_{0.10},Ca_{0.20}, Eu_{0.05}, Mn_{0.05},Fe_{0.01})_2B_5O_9Cl$ and mixed in the Example 14, thereby obtaining the color tone of the chromaticity coordinates(x,y)=(0.342,0.281). Moreover, the luminous efficiency is 21.9 lm/W at the drive condition of 20 mA. If the luminescent brightness of comparative example 1 is regarded as 100%, the luminescent brightness is about 189% in the light emitting device excited by 400 nm according to Example 19. In the light emitting device excited by 365 nm, the chromaticity coordinates(x,y)=(0.345,0.285) can be obtained and the luminescent brightness is about 121%.

EXAMPLE 22

The light emitting device is made similar to Example 14 except that $Cr_2O_3$ is used as a raw material together with the raw materials of $SrCO_3$, $BaCO_3$, $CaCO_3$, $H_3BO_3$, $Eu_2O_3$, $MnCO_3$ and $NH_4Cl$ and they are adjusted in the ratio according to $(Sr_{0.59},Ba_{0.10},Ca_{0.20}, Eu_{0.05}, Mn_{0.05},Cr_{0.01})_2B_5O_9Cl$ and mixed in the Example 14, thereby obtaining the color tone of the chromaticity coordinates(x,y)=(0.343,0.278). Moreover, the luminous efficiency is 22.3 lm/W at the drive condition of 20 mA. If the luminescent brightness of comparative example 1 is regarded as 100%, the luminescent brightness is about 192% in the light emitting device excited by 400 nm according to Example 19. In the light emitting device excited by 365 nm, the chromaticity coordinates(x,y)= (0.345,0.280) can be obtained and the luminescent brightness is about 125%.

EXAMPLE 23

The light emitting device is made similar to the device of Example 1 except that all of the raw material of $NH_4Cl$ is replaced by $NH_4Br$ and the raw materials are adjusted in the ratio according to $(Sr_{0.90}, Eu_{0.05}, Mn_{0.05})_2B_5O_9Br$ and mixed in the phosphor of the Example 1, thereby obtaining the color tone of the chromaticity coordinates (x,y)=(0.344,0.291). Moreover, the luminous efficiency is 27.4 lm/W at the drive condition of 20 mA. If the luminescent brightness of comparative example 1 is regarded as 100%, the luminescent brightness is about 236% in the light emitting device excited by 400 nm according to Example 23. In the light emitting device excited by 365 nm, the chromaticity coordinates(x,y)= (0.345,0.293) can be obtained and the luminescent brightness is about 155%.

Although NH4Br is used as a raw material instead of NH4Cl in this example, $NH_4F$ or $NH_4I$ may be used as a raw material to be replaced.

EXAMPLE 24

The light emitting device is made similar to the device of Example 1 except that a half of the raw material of $NH_4Cl$ is replaced by $NH_4F$ and the raw materials are adjusted in the ratio according to $(Sr_{0.90}, Eu_{0.05}, Mn_{0.05})_2B_5O_9Cl_{0.5}F_{0.5}$ and mixed in the phosphor of the Example 1, thereby obtaining the color tone of which chromaticity coordinates(x,y) is (0.313,0.255). Moreover, the luminous efficiency is 23.3 lm/W at the drive condition of 20 mA. If the luminescent brightness of comparative example 1 is regarded as 100%, the luminescent brightness is about 201% in the light emitting device excited by 400 nm according to Example 23. In the light emitting device excited by 365 nm, the chromaticity coordinates(x,y)=(0.315,0.257) can be obtained and the luminescent brightness is about 138%.

EXAMPLE 25

The light emitting device is made similar to the device of Example 1 except that a half of the raw material of $NH_4Cl$ is replaced by $NH_4I$ and the raw materials are adjusted in the ratio according to $(Sr_{0.90}, Eu_{0.05}, Mn_{0.05})_2B_5O_9Cl_{0.5}I_{0.5}$ and mixed in the phosphor of the Example 1, thereby obtaining the color tone of which chromaticity coordinates(x,y) is (0.327,0.270) is obtained. Moreover, the luminous efficiency is 20.7 lm/W at the drive condition of 20 mA. If the luminescent brightness of comparative example 1 is regarded as 100%, the luminescent brightness is about 178% in the light emitting device excited by 400 nm according to Example 25. In the light emitting device excited by 365 nm, the chromaticity coordinates (x,y)=(0.329,0.271) can be obtained and the luminescent brightness is about 120%.

EXAMPLE 26

The light emitting device is made similar to the device of Example 1 except that a part of the raw material of $NH_4Cl$ is replaced by $NH_4Br$ and $NH_4F$, and the raw materials are adjusted in the ratio according to $(Sr_{0.90}, Eu_{0.05}, Mn_{0.05})_2 B_5O_9Cl_{0.4}Br_{0.3}F_{0.3}$ and mixed in the phosphor of the Example 1, thereby obtaining the color tone of the chromaticity coordinates(x,y)=(0.326,0.266). Moreover, the luminous efficiency is 24.9 lm/W at the drive condition of 20 mA. If the luminescent brightness of comparative example 1 is regarded as 100%, the luminescent brightness is about 214% in the light emitting device excited by 400 nm according to Example 26. In the light emitting device excited by 365 nm, the chromaticity coordinates(x,y)=(0.328,0.268) can be obtained and the luminescent brightness is about 144%.

EXAMPLE 27

The light emitting device is made similar to the device of Example 7 except that all of the raw material of $NH_4Cl$ is replaced by $NH_4Br$ and the raw materials are adjusted in the ratio according to $(Ca_{0.90}, Eu_{0.05}, Mn_{0.05})_2B_5O_9Br$ and mixed in the phosphor of the Example 7, thereby obtaining the color tone of the chromaticity coordinates (x,y)=(0.337,0.285). Moreover, the luminous efficiency is 258 lm/W at the drive condition of 20 mA. If the luminescent brightness of comparative example 1 is regarded as 100%, the luminescent brightness is about 222% in the light emitting device of 400 nm excitation of Example 27. In the light emitting device excited by 365 nm, the chromaticity coordinates(x,y)=(0.339, 0.287) can be obtained and the luminescent brightness is about 147%.

EXAMPLE 28

The light emitting device is made similar to the device of Example 7 except that a half of the raw material of $NH_4Cl$ is replaced by $NH_4F$ and the raw materials are adjusted in the ratio according to $(Ca_{0.90}, Eu_{0.05}, Mn_{0.05})_2B_5O_9Cl_{0.5}F_{0.5}$ and mixed in the phosphor of the Example 7, thereby obtaining the color tone of which chromaticity coordinates(x,y)= (0.308,0.250). Moreover, the luminous efficiency is 22.1 lm/W at the drive condition of 20 mA. If the luminescent brightness of comparative example 1 is regarded as 100%, the luminescent brightness is about 130% in the light emitting device excited by 400 nm according to Example 28. In the light emitting device excited by 365 nm, the chromaticity coordinates(x,y)=(0.310,0.252) can be obtained and the luminescent brightness is about 190%.

EXAMPLE 29

The light emitting device is made similar to the device of Example 7 except that a half of the raw material of $NH_4Cl$ is replaced by $NH_4I$ and the raw materials are adjusted in the ratio according to $(Ca_{0.90}, Eu_{0.05}, Mn_{0.05})_2B_5O_9Cl_{0.5}I_{0.5}$ and mixed in the phosphor of the Example 7, thereby obtaining the color tone of the chromaticity coordinates(x,y)=(0.321, 0.264). Moreover, the luminous efficiency is 19.4 lm/W at the drive condition of 20 mA. If the luminescent brightness of comparative example 1 is regarded as 100%, the luminescent brightness is about 167% in the light emitting device excited by 400 nm according to Example 29. In the light emitting device excited by 365 nm, the chromaticity coordinates(x,y)= (0.324,0.266) can be obtained and the luminescent brightness is about 112%.

EXAMPLE 30

The light emitting device is made similar to the device of Example 7 except that a part of the raw material of $NH_4Cl$ is replaced by $NH_4Br$ and $NH_4F$, and the raw materials are adjusted in the ratio according to $(Ca_{0.90}, Eu_{0.05}, Mn_{0.05})_2 B_5O_9Cl_{0.4}Br_{0.3}F_{0.3}$ and mixed in the phosphor of the Example 7, thereby obtaining the color tone of which chromaticity coordinates(x,y)=(0.321,0.260) is obtained. Moreover, the luminous efficiency is 23.8 lm/W at the drive condition of 20 mA. If the luminescent brightness of comparative example 1 is regarded as 100%, the luminescent brightness is about 205% in the light emitting device excited by 400 nm according to Example 30. In the light emitting device excited by 365 nm, the chromaticity coordinates(x,y)=(0.323,0.263) can be obtained and the luminescent brightness is about 136%.

EXAMPLE 31

The light emitting device is made similar to the device of Example 14 except that all of the raw material of $NH_4Cl$ is replaced by $NH_4Br$ and the raw materials are adjusted in the ratio according to $(Sr_{0.60},Ba_{0.10},Ca_{0.20},Eu_{0.05},Mn_{0.05})_2B_5O_9Br$ and mixed in the phosphor of the Example 14, thereby obtaining the color tone of the chromaticity coordinates(x,y)=(0.338,0.286). Moreover, the luminous efficiency is 24.6 lm/W at the drive condition of 20 mA. If the luminescent brightness of comparative example 1 is regarded as 100%, the luminescent brightness is about 227% in the light emitting device excited by 400 nm according to Example 31. In the light emitting device excited by 365 nm, the chromaticity coordinates(x,y)=(0.340,0.288) can be obtained and the luminescent brightness is about 149%.

EXAMPLE 32

The light emitting device is made similar to the device of Example 14 except that a half of the raw material of $NH_4Cl$ is replaced by $NH_4F$ and the raw materials are adjusted in the ratio according to $(Sr_{0.60},Ba_{0.10},Ca_{0.20},Eu_{0.05},Mn_{0.05})_2B_5O_9Cl_{0.5}F_{0.5}$ and mixed in the phosphor of the Example 14, thereby obtaining the color tone of the chromaticity coordinates(x,y)=(0.310,0.249). Moreover, the luminous efficiency is 22.9 lm/W at the drive condition of 20 mA. If the luminescent brightness of comparative example 1 is regarded as 100%, the luminescent brightness is about 197% in the light emitting device excited by 400 nm according to Example 32. In the light emitting device excited by 365 nm, the chromaticity coordinates(x,y)=(0.340,0.288) can be obtained and the luminescent brightness is about 133%.

EXAMPLE 33

The light emitting device is made similar to the device of Example 14 except that a half of the raw material of $NH_4Cl$ is replaced by $NH_4I$ and the raw materials are adjusted in the ratio according to $(Sr_{0.60},Ba_{0.10},Ca_{0.20},Eu_{0.05},Mn_{0.05})_2B_5O_9Cl_{0.5}I_{0.5}$ and mixed in the phosphor of the Example 14, thereby obtaining the color tone of which chromaticity coordinates(x,y)=(0.320,0.264). Moreover, the luminous efficiency is 19.9 lm/W at the drive condition of 20 mA. If the luminescent brightness of comparative example 1 is regarded as 100%, the luminescent brightness is about 171% in the light emitting device excited by 400 nm according to Example 33. In the light emitting device excited by 365 nm, the chromaticity coordinates(x,y)=(0.322,0.266) can be obtained and the luminescent brightness is about 116%.

EXAMPLE 34

The light emitting device is made similar to the device of Example 14 except that a part of the raw material of $NH_4Cl$ is replaced by $NH_4Br$ and $NH_4F$, and the raw materials are adjusted in the ratio according to $(Sr_{0.60},Ba_{0.10},Ca_{0.20},Eu_{0.05},Mn_{0.05})_2B_5O_9Cl_{0.4}Br_{0.3}F_{0.3}$ and mixed in the phosphor of the Example 14, thereby obtaining the color tone of which chromaticity coordinates(x,y)=(0.320,0.262). Moreover, the luminous efficiency is 24.3 lm/W at the drive condition of 20 mA. If the luminescent brightness of comparative example 1 is regarded as 100%, the luminescent brightness is about 209% in the light emitting device excited by 400 nm according to Example 34. In the light emitting device excited by 365 nm, the chromaticity coordinates(x,y)=(0.322,0.264) can be obtained and the luminescent brightness is about 139%.

Although in this Example the phosphor in which three elements of Cl, Br and F are selected as M'' in the general formula of $(M_{1-x-y}Eu_xM'_y)_2B_5O_9M''$ is used, the selection number and the kinds of selected elements are not restricted to these as long as at least one kind is selected from halogen. When any element is selected, a light emitting device can be formed by the similar method as this Example.

EXAMPLE 35

The light emitting device is made similar to the device of Example 1 except that the color conversion layer is formed by the coating medium dispersively mixed with the phosphor of $(Sr_{0.90},Eu_{0.05},Mn_{0.05})_2B_5O_9Cl$ and the phosphor of $SrAl_2O_4$:Eu which is a second phosphor capable of emitting a green light excited by the excitation light of the LED chip 1, thereby obtaining the color tone of the chromaticity coordinates(x, y)= (0.325,0.333). Moreover, the luminous efficiency is 32.1 lm/W at the drive condition of 20 mA. If the luminescent brightness of comparative example 1 is regarded as 100%, the luminescent brightness is about 242% in the light emitting device excited by 400 nm according to Example 35. In the light emitting device excited by 365 nm, the chromaticity coordinates(x,y)=(0.323,0.335) can be obtained and the luminescent brightness is about 162%.

EXAMPLE 36

The light emitting device is made similar to the device of Example 4 except that the color conversion layer is formed by the coating medium dispersively mixed with the phosphor of $(Sr_{0.85},Eu_{0.05},Mn_{0.10})_2B_5O_9Cl$ and the phosphor of $Sr_4Al_{14}O_{25}$:Eu which is capable of emitting a blue green light excited by the excitation light of the LED chip 1 in Example 4, thereby obtaining the color tone of the chromaticity coordinates(x,y)=(0.324,0.330). Moreover, the luminous efficiency is 30.8 lm/W at the drive condition of 20 mA. If the luminescent brightness of comparative example 1 is regarded as 100%, the luminescent brightness is about 255% in the light emitting device excited by 400 nm according to Example 36. In the light emitting device excited by 365 nm, the chromaticity coordinates(x,y)=(0.328,0.333) can be obtained and the luminescent brightness is about 171%.

EXAMPLE 37

The light emitting device is made similar to the device of Example 7 except that the color conversion layer is formed by the coating medium dispersively mixed with the phosphor of $(Ca_{0.90},Eu_{0.05},Mn_{0.05})_2B_5O_9Cl$ and the phosphor of $SrAl_2O_4$:Eu which is capable of emitting a green light excited by the excitation light of the LED chip 1 in Example 7, thereby obtaining the color tone of the chromaticity coordinates(x, y)= (0.320,0.327). Moreover, the luminous efficiency is 31.1 lm/W at the drive condition of 20 mA. If the luminescent brightness of comparative example 1 is regarded as 100%, the luminescent brightness is about 240% in the light emitting device excited by 400 nm according to Example 37. In the light emitting device excited by 365 nm, the chromaticity coordinates(x,y)=(0.318,0.330) can be obtained and the luminescent brightness is about 158%.

EXAMPLE 38

The light emitting device is made similar to the device of Example 10 except that the color conversion layer is formed by the coating medium dispersively mixed with the phosphor of $(Ca_{0.85},Eu_{0.05},Mn_{0.10})_2B_5O_9Cl$ and the phosphor of $Sr_4Al_{14}O_{25}$:Eu which is capable of emitting a blue green light excited by the excitation light of the LED chip 1 in Example 10, thereby obtaining the color tone of chromaticity coordinates(x,y)=(0.324,0.328). Moreover, the luminous efficiency is 29.8 lm/W at the drive condition of 20 mA. If the luminescent brightness of comparative example 1 is regarded as 100%, the luminescent brightness is about 239% in the light emitting device of 400 nm excitation of Example 38. In the light emitting device of 365 nm excitation, the chromaticity coordinates(x,y)=(0.324,0.329) can be obtained and the luminescent brightness is about 160%.

EXAMPLE 39

The light emitting device is made similar to the device of Example 14 except that the color conversion layer is formed by the coating medium dispersively mixed with the phosphor of $(Sr_{0.06},Ba_{0.10},Ca_{0.20},Eu_{0.05},Mn_{0.10})_2B_5O_9Cl$ and the phosphor of $SrAl_2O_4$:Eu which is a second phosphor capable of emitting a green light excited by the excitation light of the LED chip 1 in Example 14, thereby obtaining the color tone of the chromaticity coordinates(x,y)=(0.320,0.327). Moreover, the luminous efficiency is 35.5 lm/W at the drive condition of 20 mA. If the luminescent brightness of comparative example 1 is regarded as 100%, the luminescent brightness is about 259% in the light emitting device excited by 400 nm excitation according to Example 39. In the light emitting device excited by 365 nm, the chromaticity coordinates(x,y)=(0.320,0.328) can be obtained and the luminescent brightness is about 169%.

EXAMPLE 40

The light emitting device is made similar to the device of Example 17 except that the color conversion layer is formed by the coating medium dispersively mixed with the phosphor of $(Sr_{0.55},Ba_{0.10}, Ca_{0.20},Eu_{0.05},Mn_{0.10})_2B_5O_9Cl$ and the phosphor of $Sr_4Al_{14}O_{25}$:Eu which is a second phosphor capable of emitting a blue green light excited by the excitation light of the LED chip 1 in the Example 17, thereby obtaining the color tone of the chromaticity coordinates (x,y)=(0.319, 0.330). Moreover, the luminous efficiency is 30.8 lm/W at the drive condition of 20 mA. If the luminescent brightness of comparative example 1 is regarded as 100%, the luminescent brightness is about 256% in the light emitting device excited by 400 nm according to Example 40. In the light emitting device excited by 365 nm, the chromaticity coordinates(x,y)=(0.320,0.333) can be obtained and the luminescent brightness is about 167%.

EXAMPLE 41

The light emitting device is made similar to the device of Example 8 except that the color conversion layer is formed by the coating medium dispersively mixed with the phosphor of $(Ca_{0.94},Eu_{0.05},Mn_{0.01})_2B_5O_9Cl$ and the phosphor of $(Y_{0.8}Gd_{0.2})_3Al_5O_{12}$:Ce which is a second phosphor capable of emitting a yellow light excited by the light emitted from the first phosphor in Example 8, thereby obtaining the color tone of the chromaticity coordinates(x,y)=(0.325,0.334). Moreover, the luminous efficiency is 25.8 lm/W at the drive condition of 20 mA. Although, the light emitting device is constituted by adding the second phosphor to the light emitting device of example 8 in this example, the light emitting device of any one of examples 1-40 may include the second phosphor in the color conversion layer in the similar way.

EXAMPLE 42

The light emitting device is made similar to the device of Example 41 except that the phosphor of $(Ca_{0.64},Ba_{0.10},Sr_{0.20},Eu_{0.05},Mn_{0.01})_2B_5O_9Cl$ is used as a first phosphor in Example 41, thereby obtaining the color tone of the chromaticity coordinates(x,y)=(0.323,0.338). Moreover, the luminous efficiency is 25.7 lm/W at the drive condition of 20 mA.

EXAMPLE 43

The light emitting device is made similar to the device of Example 41 except that the phosphor of $(Ca_{0.64},Ba_{0.10},Sr_{0.20},Eu_{0.50},Sn_{0.01})_2B_5O_9Cl$ is used as a first phosphor in Example 41, thereby obtaining the color tone of which chromaticity coordinates(x,y)=(0.323, 0.338) is obtained. Moreover, the luminous efficiency is 23.5 lm/W at the drive condition of 20 mA.

EXAMPLE 44

The light emitting device is made similar to the device of Example 41 except that the phosphor of $(Ca_{0.64},Ba_{0.10},Sr_{0.20},Eu_{0.50},Fe_{0.01})_2B_5O_9Cl$ is used as a first phosphor in Example 41, thereby obtaining the color tone of which chromaticity coordinates (x,y)=(0.322,0.333). Moreover, the luminous efficiency is 24.8 lm/W at the drive condition of 20 mA.

EXAMPLE 45

The light emitting device is made similar to the device of Example 41 except that the phosphor of $(Ca_{0.64},Ba_{0.10},Sr_{0.20},Eu_{0.50},Cr_{0.01})_2B_5O_9Cl$ is used as a first phosphor in Example 41, thereby obtaining the color tone of which chromaticity coordinates(x,y)=(0.324,0.335) is obtained. Moreover, the luminous efficiency is 23.9 lm/W at the drive condition of 20 mA.

INDUSTRIAL APPLICABILITY

The present invention makes it possible to produce the light emitting device having a high brightness and a good color rendering property with a good process yield, making good use of advantages of a semiconductor light emitting element. With this, it can be used as a light source such as a lighting apparatus of a medical application, and the flash plate of a copying machine, in which the good color rendering properties are required. Since the phosphor of the present invention has the excitation spectrum having a wide half band width and a nearly flat portion in the vicinity of the wavelength in which relative luminous efficiency is high, the color shading generated by the dispersion of the emission spectra of the light emitting elements is improved. Moreover, the present invention makes it possible to produce a light emitting element with a good productivity due to its relatively simple structure. The light emitting device having a good color rendering property, in which the component of long wavelength is taken out comparatively easily, can be obtained. The light emitting device capable of emitting a white light, emitting a desired neutral color with high brightness, and adjusting a delicate color tone, can be obtained.

The invention claimed is:

1. A light emitting device comprising a semiconductor light emitting element and a phosphor which converts a part of a luminescence spectrum emitted from the semiconductor light emitting element;

wherein said luminescence spectrum of said semiconductor light emitting element is located between a near ultraviolet region and a short-wavelength visible region, wherein said phosphor is made by adding a red luminescent activator to a base material of a blue luminescent phosphor, wherein said phosphor is represented by a general formula of $(M_{1-x-y}Eu_xM'_y)_2B_5O_9M''$, where M is at least one selected from the group consisting of Mg, Ca, Ba, Sr, M' is at least one selected from the group consisting of Mn, Fe, Cr, Sn, $0.0001 \leq x \leq 0.5$, $0.0001 \leq y \leq 0.5$, and M'' is at least one halogen selected from the group consisting of F, Cl, Br, I.

2. The light emitting device according to claim 1;
wherein the emission wavelength can be adjusted by the added ratio of said red luminescent activator.

3. The light emitting device according to claims 1;
wherein said semiconductor light emitting element has a main peak wavelength more than 360 nm in the ultraviolet region.

4. A light emitting device comprising a semiconductor light emitting element and a phosphor which converts a part of a luminescence spectrum emitted from the semiconductor light emitting element;

wherein said luminescence spectrum of said semiconductor light emitting element is located between a near ultraviolet region and a short-wavelength visible region, wherein said phosphor is made by adding a red luminescent activator to a base material of a blue luminescent phosphor, wherein said phosphor is an alkaline earth metal boric halide phosphor activated by at least Mn and Eu.

5. A light emitting device comprising;
a semiconductor light emitting element of which luminescence spectrum is located between a near ultraviolet region and a short-wavelength visible region, a first phosphor which converts a part of a luminescence spectrum emitted from the semiconductor light emitting element, said first phosphor being made by adding an activator for red light emission to a base material of a blue emitting phosphor, a second phosphor which can convert a part of the light emitted from the first phosphor to a light having a wavelength in a range from blue region to red region, wherein a mixed light of the light emitted from the first phosphor and the light emitted from the second phosphor is outputted, said mixed light having a wavelength within a range of white region, wherein said first phosphor is represented by a general formula of $(M_{1-x-y}Eu_xM'_y)_2B_5O_9M''$, where M is at least one selected from the group consisting of Mg, Ca, Ba, Sr, M' is at least one selected from the group consisting of Mn, Fe, Cr, Sn, $0.0001 \leq x \leq 0.5$, $0.0001 \leq y \leq 0.5$, and M'' is at least one halogen selected from the group consisting of F, Cl, Br, I.

* * * * *

UNITED STATES PATENT AND TRADEMARK OFFICE
CERTIFICATE OF CORRECTION

PATENT NO. : 7,733,002 B2
APPLICATION NO. : 12/230127
DATED : June 8, 2010
INVENTOR(S) : Yoshinori Murazaki It is certified that error appears in the above-identified patent and that said Letters Patent is hereby corrected as shown below:

On the Cover Page

In section (62) "Related U.S. Application Data", insert the following after "Pat. No. 7,432,642"

--, which is a National Stage Entry of PCT/JP02/04179, filed April 25, 2002--.

Signed and Sealed this

Seventh Day of December, 2010

David J. Kappos
*Director of the United States Patent and Trademark Office*